(12) United States Patent
Teng et al.

(10) Patent No.: US 11,742,348 B2
(45) Date of Patent: Aug. 29, 2023

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Li-Feng Teng, Hsinchu (TW); Wei-Cheng Wu, Hsinchu County (TW); Harry-Hak-Lay Chuang, Zhubei (TW); Li-Jung Liu, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 32 days.

(21) Appl. No.: 17/183,564

(22) Filed: Feb. 24, 2021

(65) Prior Publication Data
US 2022/0271031 A1    Aug. 25, 2022

(51) Int. Cl.
*H01L 27/088* (2006.01)
*H01L 21/8234* (2006.01)
*H01L 29/66* (2006.01)

(52) U.S. Cl.
CPC .. *H01L 27/0886* (2013.01); *H01L 21/823431* (2013.01); *H01L 21/823456* (2013.01); *H01L 21/823468* (2013.01); *H01L 29/6656* (2013.01)

(58) Field of Classification Search
CPC ............. H01L 27/0886; H01L 27/0924; H01L 21/823431; H01L 21/823468; H01L 21/823821; H01L 29/6656; H01L 29/785; H01L 29/41791
See application file for complete search history.

(56) References Cited

U.S. PATENT DOCUMENTS

| | | | |
|---|---|---|---|
| 9,553,024 B2* | 1/2017 | Tokita | H01L 29/7833 |
| 9,716,171 B2* | 7/2017 | Kim | H01L 27/088 |
| 2013/0175611 A1* | 7/2013 | Shinohara | H01L 21/823807 |
| | | | 257/334 |
| 2016/0149017 A1* | 5/2016 | Tsai | H01L 21/28247 |
| | | | 257/288 |

* cited by examiner

*Primary Examiner* — Tuan A Hoang
(74) *Attorney, Agent, or Firm* — Birch, Stewart, Kolasch & Birch, LLP

(57) ABSTRACT

A semiconductor device includes a substrate, a first gate structure and a second gate structure, a first gate spacer and a second gate spacer. The first gate spacer includes a first layer, a second layer over the first layer, a third layer over the second layer, a fourth layer over the third layer, and a fifth layer of the fourth layer, in which the first layer, the third layer, and the fifth layer of the first gate spacer are made of a same material. The second gate spacer includes a first layer, a second layer over the first layer, and a third layer over the second layer, in which the first layer and the third layer of the second gate spacer are made of a same material, and in which a lateral width of the first gate spacer is greater than a lateral width of the second gate spacer.

20 Claims, 28 Drawing Sheets

M1

| first and second semiconductor fins are formed over an I/O region and a core region of a substrate, first and second dummy gate structures are formed over the first and second semiconductor fins, and a first spacer layer is formed over the substrate. | ~S101 |

↓

| second and third spacer layers are formed over the substrate. | ~S102 |

↓

| the second and third spacer layers within the core region are removed. | ~S103 |

↓

| the fourth and fifth spacer layers are formed over the substrate | ~S104 |

↓

| the first, second, third, fourth, and fifth spacer layers are patterned to form first and second gate spacers. | ~S105 |

↓

| recesses are formed in the first and second semiconductor fins. | ~S106 |

↓

| epitaxial source/drain structures are formed in the recesses. | ~S107 |

↓

| patterned masks over the first and second dummy gate structures and the first and second gate spacers are etched back. | ~S108 |

↓

| a CESL and a first ILD are formed. | ~S109 |

↓

| a planarization process is performed. | ~S110 |

↓

| the first and second dummy gate structures are replaced with first and second gate structures. | ~S111 |

↓

| a second ILD is formed over the first ILD, and contacts are formed. | ~S112 |

Fig. 14

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 13B illustrate a method in various stages of forming a semiconductor device in accordance with some embodiments of the present disclosure, in which FIGS. 2A, 3A, 4A, 5A, 6A, 7A, 8A, 9A, 10A, 11A, 12A, and 13A are cross-sectional views along line B-B of FIG. 1A, and FIGS. 2B, 3B, 4B, 5B, 6B, 7B, 8B, 9B, 10B, 11B, 12B, and 13B are cross-sectional views along line C-C of FIG. 1A.

FIG. 14 illustrates a method of forming a semiconductor device in accordance with some embodiments of the present disclosure.

DETAILED DESCRIPTION

Figure 1A:
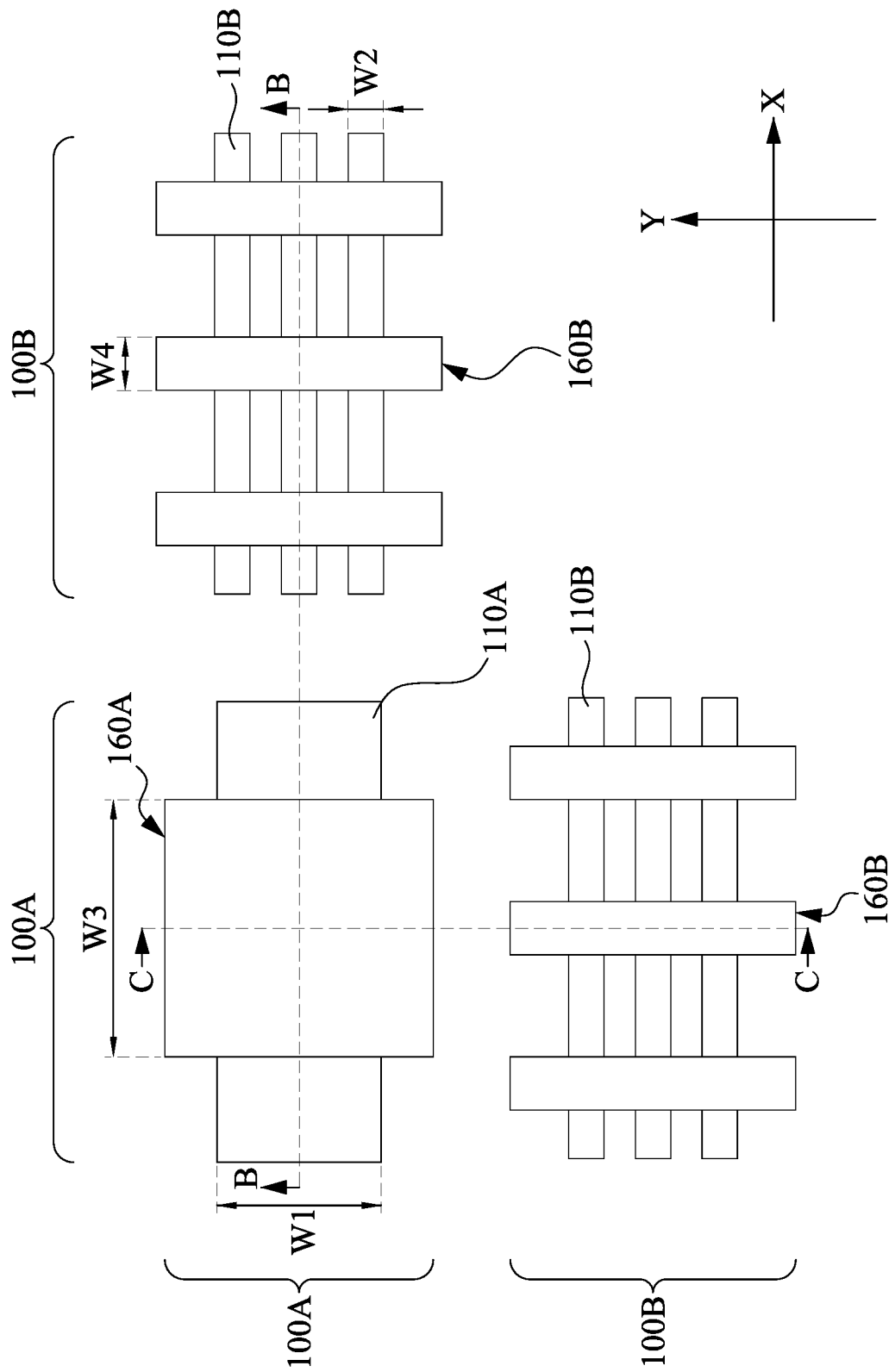
FIG. 1A is a top view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
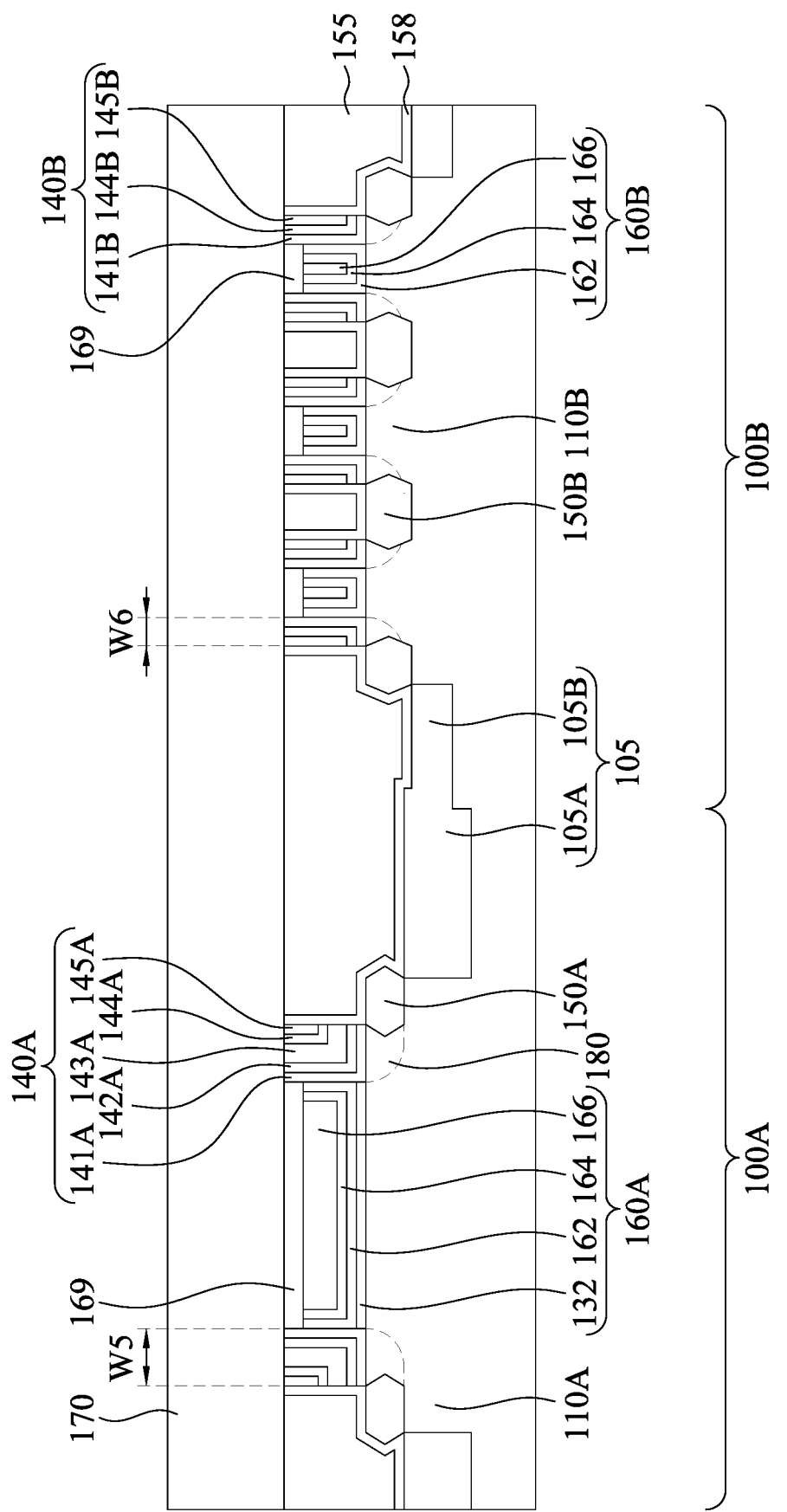
FIGS. 1B and 1C are cross-sectional views of the semiconductor device of FIG. 1A in accordance with some embodiments.
Figure 1C:
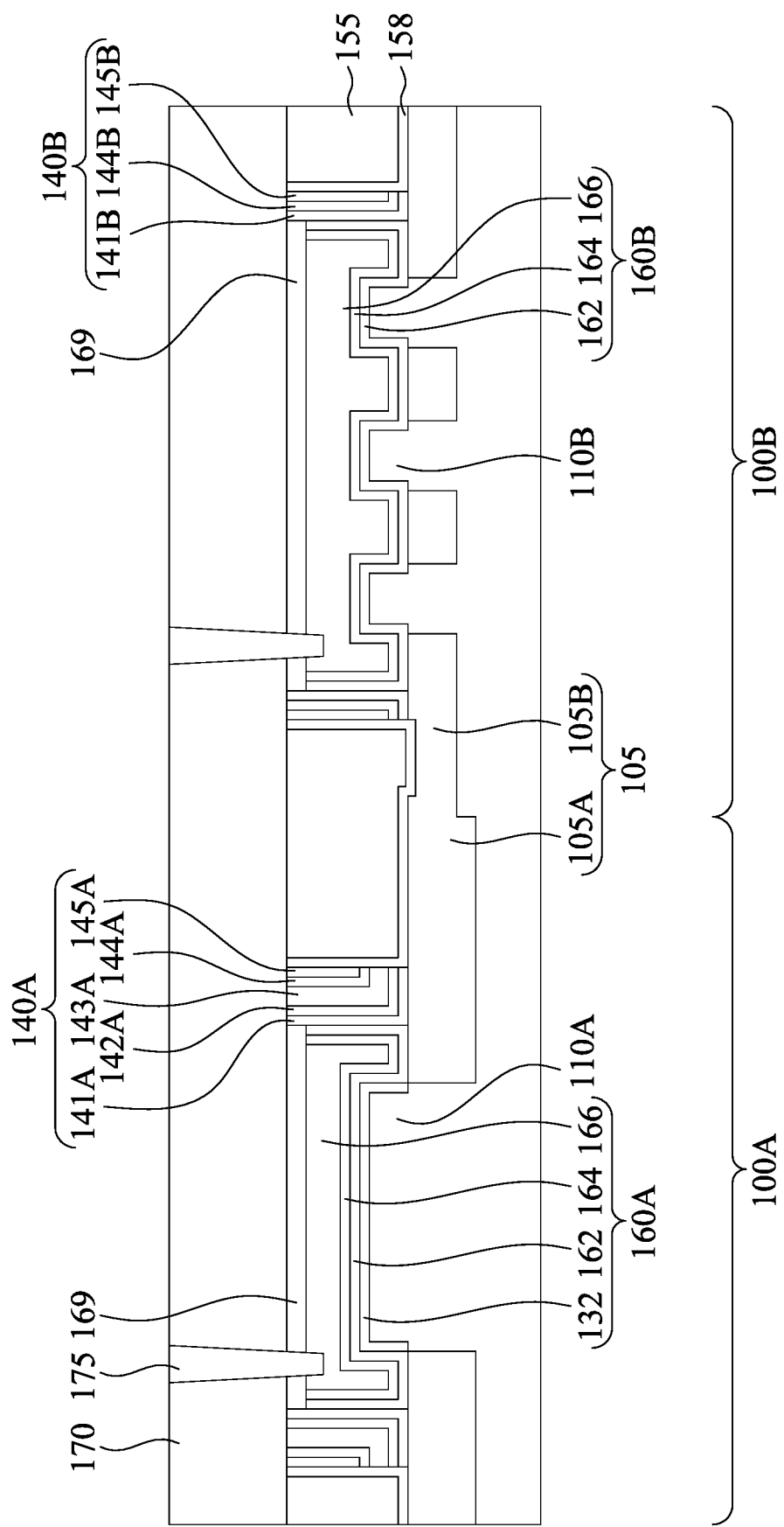

FIG. 1A is a top view of a semiconductor device in accordance with some embodiments. FIG. 1B is a cross-sectional view along line B-B of FIG. 1A, and FIG. 1C is a cross-sectional view along line C-C of FIG. 1A, respectively. It is noted that some elements in FIGS. 1B and 1C are not shown in FIG. 1A for simplicity.

Reference is made to FIGS. 1A to 1C, shown there is a substrate 100. The substrate 100 may be made of silicon or other semiconductor materials. Alternatively or additionally, the substrate 100 may include other elementary semiconductor materials such as germanium. In some embodiments, the substrate 100 is made of a compound semiconductor such as silicon carbide (SiC), gallium arsenic (GaAs), indium arsenide (InAs), or indium phosphide (InP). In some embodiments, the substrate 100 is made of an alloy semiconductor such as silicon germanium (SiGe), silicon germanium carbide (SiGeC), gallium arsenic phosphide (GaAsP), or gallium indium phosphide (GaInP). In some embodiments, the substrate 100 includes an epitaxial layer. For example, the substrate 100 has an epitaxial layer overlying a bulk semiconductor.

The substrate 100 includes at least one input/output (I/O) region 100A and core/regions 100B. In FIG. 1A, although one I/O region 100A and two core/regions 100B are depicted, it is understood that any suitable number of I/O region 100A and core/region 100B may be applied in other embodiments.

The substrate 100 includes a semiconductor fin 110A within the I/O region 100A, and semiconductor fins 110B within the core/regions 100B. In some embodiments, the semiconductor fins 110A and 110B may include the same material as the substrate 100. The semiconductor fins 110A and 110B extend along a first direction (e.g., the X direction in FIG. 1A). In some embodiments, the semiconductor fin 110A has a width W1 greater than a width W2 of each of the semiconductor fins 110B along a second direction (e.g., the Y direction in FIG. 1A), in which the second direction is substantially vertical to the first direction. In some embodiments, the width W1 of the semiconductor fin 110A is in a range from about 0.6 μm to about 9 μm, and the width W2 of each semiconductor fin 110B is in a range from about 0.2 μm to about 0.9 μm.

As shown in FIGS. 1B and 1C, an isolation structure 105, such as a shallow trench isolation (STI) structure, is disposed over the substrate 100 to surround the semiconductor fins 110A and 110B. In some embodiments, lower portions of the semiconductor fins 110A and 110B are surrounded by the isolation structure 108, while upper portions of the semiconductor fins 110A and 110B protrude from the isolation structure 105, as shown in FIGS. 1B and 1C. In other words, portions of the semiconductor fins 110A and 110B are embedded in the isolation structure 105. The isolation structure 105 prevents electrical interference or crosstalk. In some embodiments, the isolation structure 105 may include dielectric material, such as $SiO_2$, $Si_3N_4$, $SiO_xN_y$, fluorine-doped silicate glass (FSG), a low-k dielectric, combinations thereof, and/or other suitable materials.

As shown in FIGS. 1B and 1C, the isolation structure 105 between the semiconductor fin 110A and the semiconductor fin 110B has a first portion 105A close to the semiconductor fin 110A (or within the I/O region 100A) and a second portion 105B close to the semiconductor fin 110B (or within the core region 100B). In some embodiments, the bottom surface of the first portion 105A is lower than the bottom surface of the second portion 105B. In FIG. 1B, the top surface of the first portion 105A is higher than the top surface of the second portion 105B. That is, the first portion 105A is thicker than the second portion 105B. In FIG. 1B, the isolation structure 105 between the semiconductor fin 110A and the semiconductor fin 110B may include a stepped bottom surface and a stepped top surface. From another perspective, the interface between the first portion 105A and the substrate 100 is lower than the interface between the second portion 105B and the substrate 100.

In FIG. 1C, the top surface of the second portion 105B of the isolation structure 105 has a first segment 1052 and a second segment 1054, in which the first segment 1052 is directly below the first ILD 155 and in contact with the CESL 158, and the second segment is directly below and in contact with one of the gate spacers 140B and the gate structure 160B. In some embodiments, the first segment 1052 of the top surface of the second portion 105B of the isolation structure 105 is lower than the second segment 1054 of the top surface of the second portion 105B of the isolation structure 105. In some embodiments, the CESL 158 extends from the sidewall of the gate spacer 140B to the sidewall of the isolation structure 105.

Reference is made to FIGS. 1A to 1C, a gate structure 160A is disposed over and crossing the semiconductor fin 110A, and gate structures 160B are disposed over and crossing the semiconductor fins 110B. The gate structures 160A and 160B extend along the second direction (e.g., the Y direction in FIG. 1A). In some embodiments, the gate structure 160A has a width W3 greater than a width W4 of each of the gate structures 160B along the first direction (e.g., the X direction in FIG. 1A). In some embodiments, the width W3 of the gate structure 160A is in a range from about 0.243 μm to about 2 μm, and the width W4 of each gate structure 160B is in a range from about 0.005 μm to about 0.9 μm.

In some embodiments, the gate structure 160A may include a gate dielectric 132, a gate dielectric layer 162, a work function metal layer 164, and a filling metal 166. The gate structures 160B may include a gate dielectric layer 162, a work function metal layer 164, and a filling metal 166. That is, the gate structures 160B may be free of gate dielectric 132 of the gate structure 160A. The gate dielectric 132 may be silicon oxide. The gate dielectric layer 162 may include high-K dielectrics, such as $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The work function metal layer 164 may be a p-type work function layers for p-type device, or an n-type work function layers for n-type device. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, TiN, Ag, TaAl, TaAlC, TiAlN, TaC, TaCN, TaSiN, Mn, Zr, other suitable n-type work function materials, or combinations thereof. The work function metal layer 164 may include a plurality of layers. In some embodiments, the filling metal 166 may include tungsten (W). In some other embodiments, the gate electrode includes aluminum (Al), copper (Cu) or other suitable conductive material.

Capping layers 169 are disposed over the gate structure 160A and the gate structures 160B, respectively. In some embodiments, the capping layers 165 may include dielectric material, such as $SiO_2$, $Si_3N_4$, $SiO_xN_y$, the like, or combinations thereof.

Reference is made to FIGS. 1B and 1C, gate spacers 140A are disposed on opposite sidewalls of the gate structure 160A, and gate spacers 140B are disposed on opposite sidewalls of the gate structures 160B. In some embodiments, each gate spacer 140A has a width W5 greater than a width W6 of each gate spacer 140B either along the first direction (e.g., FIG. 1B) or along the second direction (e.g. FIG. 1C). In some embodiments, the width W5 is in a range from about 15 nm to about 40 nm, and the width W6 is in a range from about_5_ μm to about_20_ μm. If the width W5 is too low, the reliability of a high voltage device (such as device in I/O region 100A) may be deteriorated when a high voltage is applied to the device. If the width W5 is too high, the device size may increase without significant improvement.

In FIG. 1C, the gate spacers 140A and 140B are disposed over and in contact with the isolation structure 105. In some embodiments, with respect to the isolation structure 105 between the semiconductor fin 110A and the semiconductor fin 110B, a gate spacer 140A is disposed over the first portion 105A of the isolation structure 105, and a gate spacer 140B is disposed over the second portion 105B of the isolation structure 105. Because the first portion 105A of the isolation structure 105 is thicker than the second portion 105B of the isolation structure 105, the vertical distance between the gate spacer 140A and the substrate 100 is greater than the vertical distance between the gate spacer 140B and the substrate 100.

In some embodiments, the gate spacers 140A and 140B may be multi-layer structures. For example, each of the gate spacers 140A includes, in order, spacer layers 141A, 142A, 143A, 144A and 145A. Each of the gate spacers 140B includes, in order, spacer layers 141B, 144B and 145B. In some embodiments, each of the gate spacers 140A may include more layers than each of the gate spacers 140B. For example, each of the gate spacers 140A may include two layers more than each of the gate spacers 140B in the depicted embodiments. In some embodiments, the spacer layers 142A and 143A of the gate spacers 140A are absent in the gate spacers 140B.

In some embodiments, the spacer layers 141A and 141B may include silicon nitride (SiN). The spacer layer 142A may include silicon oxide (SiO$_2$). The spacer layer 143A may include silicon nitride (SiN). The spacer layers 144A and 144B may include silicon oxycarbonitride (SiOCN), silicon oxycarbide (SiOC), or silicon carbide (SiC). The spacer layers 145A and 145B may include silicon nitride (SiN). In some embodiments, the spacer layer 141A of the gate spacers 140A and the spacer layer 141B of the gate spacers 140B may include the same material and substantially the same thickness, the spacer layer 144A of the gate spacers 140A and the spacer layer 144B of the gate spacers 140B may include the same material and substantially the same thickness, and the spacer layer 145A of the gate spacers 140A and the spacer layer 145B of the gate spacers 140B may include the same material and substantially the same thickness.

With respect to the gate spacers 140A, in some embodiments, the spacer layers 141A, 143A, and 145A of the gate spacers 140A are made of the same material, which is different from the materials of the spacer layers 142A and 144A. The spacer layers 142A and 144A may be made of different materials. In some embodiments, the spacer layer 143A has a greatest thickness among the gate spacers 140A. That is, the thickness of the spacer layer 143A is greater than the thicknesses of the spacer layers 141A, 142A, 144A, and 145A. In some embodiments, the thickness of the spacer layer 143A is also greater than the thicknesses of the spacer layers 141B, 144B, and 145B of the gate spacers 140B.

In some embodiments, the spacer layers 141A, 142A, 143A, and 144A may include an L-shape cross-section. That is, each of the spacer layers 141A, 142A, 143A, and 144A may include a horizontal portion and a vertical portion extending upwardly from an end of the horizontal portion. In some embodiments, the horizontal portion and the vertical portion of the spacer layer 143A is thicker than the horizontal portions and the vertical portions of the spacer layers 141A, 142A, and 144A, respectively. On the other hand, the spacer layer 145A may include a linear shape cross-section.

With respect to the gate spacers 140B, in some embodiments, the spacer layers 141B and 145B of the gate spacers 140B are made of the same material, which is different from the material of the spacer layer 144B.

In some embodiments, the spacer layers 141B and 144B may include an L-shape cross-section. That is, each of the spacer layers 141B and 144B may include a horizontal portion and a vertical portion extending upwardly from an end of the horizontal portion. On the other hand, the spacer layer 145B may include a linear shape cross-section.

With respect to the spacer layer 141A of the gate spacers 140A and the spacer layer 141B of the gate spacer 140B, the horizontal portion of the spacer layer 141A may be longer than the horizontal portion of the spacer layer 141B. That is, the length of the horizontal portion of the spacer layer 141A is greater than the length of the horizontal portion of the spacer layer 141B. On the other hand, the vertical portion of the spacer layer 141A may have the same length (along vertical direction in FIGS. 1B and 1C) as the vertical portion of the spacer layer 141B.

With respect to the spacer layers 144A and 144B, in some embodiments, vertical portion of the spacer layer 144A is shorter than the vertical portion of the spacer layer 144B, which results in that the bottom surface of the spacer layer 144A is higher than the bottom surface of the spacer layer 144B, while the top surface of the spacer layer 144A is substantially level with the top surface of the spacer layer 144B. Furthermore, the horizontal portion of the spacer layer 144A may include substantially the same width as the horizontal portion of the spacer layer 144B.

With respect to the spacer layers 145A and 145B, in seine embodiments, the spacer layer 145A is shorter than the spacer layer 145B, which results in that the bottom surface of the spacer layer 145A is higher than the bottom surface of the spacer layer 145B, while the top surface of the spacer layer 145A is substantially level with the top surface of the spacer layer 145B.

With respect to the spacer layers 141A, 144A, 141B, and 144B, in some embodiments, the length difference (along the horizontal direction in FIGS. 1B and 1C) between the horizontal portions of the spacer layers 141A and 141B is greater than the length difference between the horizontal portions of the spacer layers 144A and 144B.

Lightly doped source and drain (LDD) regions 180 are disposed in the semiconductor fins 110A and 110B under the gate spacers 140A and 140B, respectively. In some embodiments, the LDD regions 180 may include n-type impurities such as phosphorus (P), arsenic (As), or antimony (Sb), or p-type impurities such as boron (B), gallium (Ga), indium (In), aluminium (Al).

Epitaxial source/drain structures 150A and 150B are disposed in the semiconductor fin 110A and 110B, respectively. In some embodiments, the epitaxial source/drain structures 150A are formed on opposite sides of the gate structure 160A, and the epitaxial source/drain structures 150B are formed on opposite sides of the gate structure 160B.

In some embodiments, the epitaxial source/drain structures 150A and 150B may include Ge, Si, GaAs, AlGaAs, SiGe, GaAsP, SiP, or other suitable material. In some embodiments, the epitaxial source/drain structures 150A and 150B may include p-type dopants such as boron (B), gallium (Ga), indium (In), aluminium (Al) for formation of p-type FETs. In other embodiments, the epitaxial source/drain structures 150A and 150B may include n-type dopants such as phosphorus (P), arsenic (As), or antimony (Sb) for formation of n-type FETs.

The gate structure 160A contributes a gate region of a transistor within the I/O region 100A, the epitaxial source/drain structures 150A contribute source/drain regions of the transistor within the I/O region 100A, and portion of the semiconductor fin 110A underlying the gate structure 160A contributes a channel region of the transistor within the I/O region 100A. The gate structure 160B contributes a gate region of a transistor within the core region 100B, the epitaxial source/drain structures 150B contribute source/drain regions of the transistor within the core region 100B, and portion of the semiconductor fin 110B underlying the gate structure 160B contributes a channel region of the transistor within the core region 100B.

A first interlayer dielectric (ILD) 155 is deposited over the epitaxial source/drain structures 150A and 150B and laterally surrounds the gate structures 160A and 160B. In some embodiments, the first ILD 155 may include dielectric materials such as phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 158 is disposed between the first ILD 155 and the epitaxial source/drain structures 150A and 150B. The CESL 158 may extend along sidewalls of the gate spacers 140A and 140B, and may extend along top surface of the isolation structure 105. The CESL 158 may include a dielectric material, such as, silicon nitride, silicon oxide, silicon oxynitride, or the like, having a different etch rate than the material of the overlying first ILD 155.

A second interlayer dielectric (ILD) 170 is disposed over the first ILD 155. In some embodiments, the material of the ILD layer 170 may be similar to the ILD layer 150. In some embodiments, the second ILD 170 may include dielectric materials such as phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, an etch stop layer (not shown) may be optionally formed between the second ILD 170 and the first ILD 155.

Reference is made to FIG. 1C, gate contacts 175 extend through the second ILD 170 and the capping layers 165 to the top surfaces of the gate structures 160A and 160B, respectively. The gate contacts 175 may include one or more layers, such as barrier layers, diffusion layers, and fill materials. In some embodiments, the contacts each may include a barrier layer made of titanium, titanium nitride, tantalum, tantalum nitride, or the like, and a conductive material made of copper, a copper alloy, silver, gold, tungsten, cobalt, aluminum, nickel, or the like. In some embodiments, source/drain contacts (not shown) may be formed extending through the second ILD 170, the first ILD 155, and the CESL 158 to the top surfaces of the epitaxial source/drain structures 150A and 150B.

FIGS. 2A-13B illustrate a method in various stages of forming a semiconductor device in accordance with some embodiments of the present disclosure. It is noted that FIGS. 2A, 3A . . . 13A are cross-sectional views along line B-B of FIG. 1A, and FIGS. 2B, 2B, 3B . . . 13B are cross-sectional views along line C-C of FIG. 1A. Some elements of FIGS. 2A to 13B are the same as those described above with respect to FIGS. 1A to 1C, such elements are labeled the same and will not be repeated for simplicity.

Figure 2A:
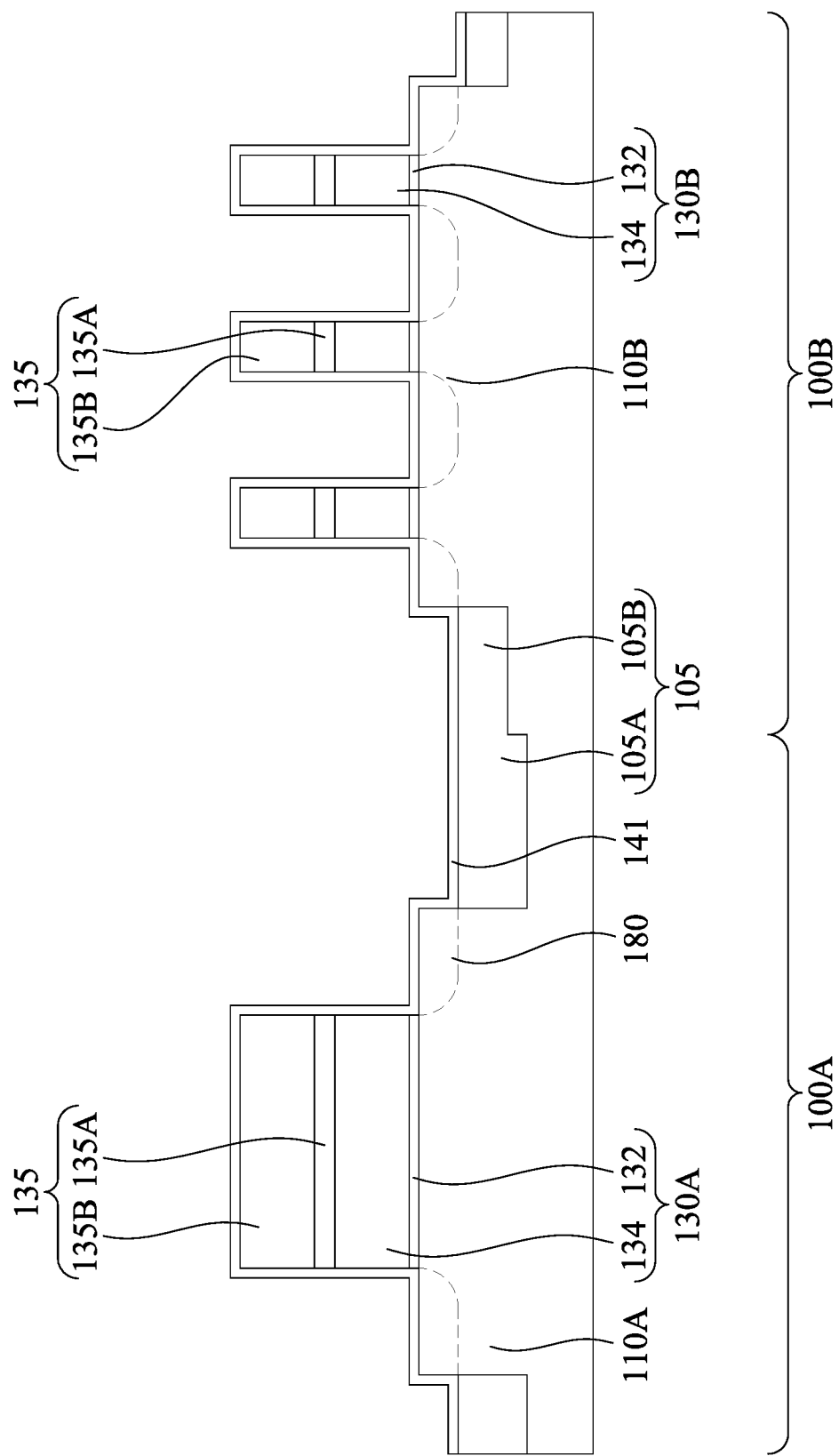
Figure 2B:
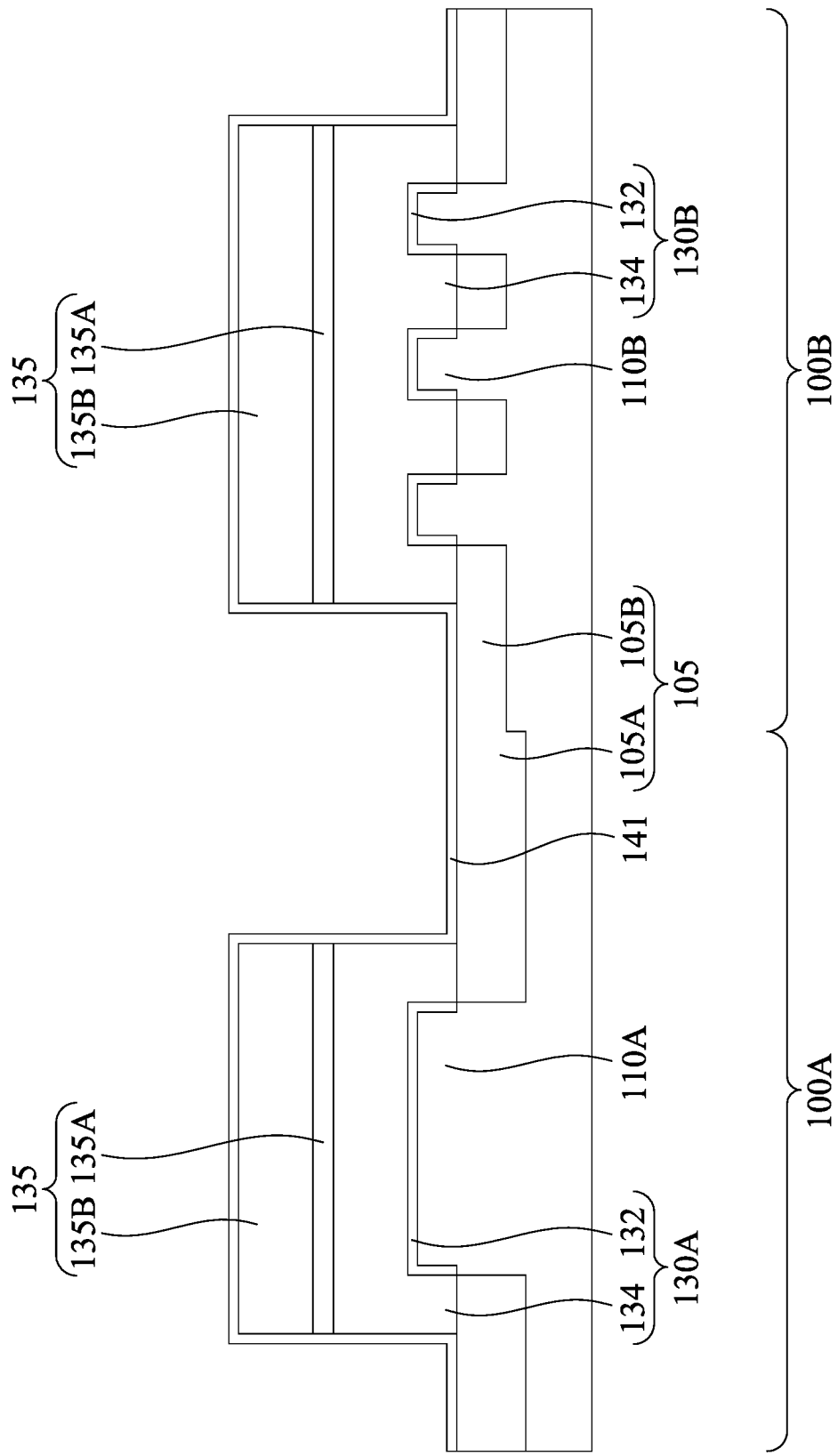

Reference is made to FIGS. 2A and 2B. Semiconductor fins 110A and 110B are formed over a substrate 100. In particular, the semiconductor fin 110A are formed within the I/O region 100A of the substrate 100, and the semiconductor fins 110B are formed within the core region 100B of the substrate 100. In some embodiments, the semiconductor fins 110A and 110B may be formed by etching trenches in the substrate 100, the etching may be any acceptable etch process, such as a reactive ion etch (RIE), neutral beam etch (NBE), the like, or a combination thereof.

After forming the semiconductor fins 110A and 110B, top surfaces of portions of the substrate 100 within the I/O region 100A and the core regions 100B may have different height due to loading effect. "Loading effect" means that the etch rate is not the same among different pattern densities. More specifically, the loading effect is caused by the difference of the pattern density between the I/O region 100A and the core region 100B. As shown in FIGS. 2A and 2B, the loading effect occurs, and therefore the height of fin 110A is higher than the height of fin 110B.

Isolation structure 105 is formed over the substrate 100 and laterally surrounding the semiconductor fins 110A and 110B. The isolation structure 105 may be formed by, for example, depositing a dielectric material over the substrate 100, performing a planarization process, such as a CMP process to the dielectric material, and then etching back the dielectric material to lower a top surface of the dielectric material to a position lower than top surfaces of the semiconductor fins 110A and 110B. The isolation structure 105 may be deposited by high-density plasma CVD (HDP-CVD), flowable CVD (FCVD), the like, or a combination thereof.

Dummy gate structures 130A and 130B are formed over and crossing the semiconductor fins 110A and 110B, respectively. In some embodiments, patterned masks 135 may be formed over the dummy gate structures 130A and 130B, respectively. In some embodiments, the dimension relationship between the dummy gate structures 130A and 130B are similar to those described with respect to the gate structures 160A and 160B, and thus relevant details will not be repeated for simplicity.

In some embodiments, each of the dummy gate structures 130A and 130B may include a dummy gate 134 and a dummy gate dielectric 132. The dummy gate dielectric 132 may be, for example, silicon oxide, silicon nitride, a combination thereof, or the like, and may be deposited or thermally grown according to acceptable techniques. The dummy gate 134 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate 134 and the dummy gate dielectric 132 may be formed by, for example, depositing a dummy dielectric layer and a dummy gate layer over the substrate 100, forming the patterned masks 135 over the dummy gate layer, and then performing a patterning process to the dummy dielectric layer and the dummy gate layer by using the patterned masks 135 as an etching mask. In some embodiments, the dummy gate 134 may be deposited by physical vapor deposition (PVD), CVD, sputter deposition, or other techniques for depositing the selected material. In some embodiments, the dummy gate dielectric 132 may be formed by thermal oxidation, such that the dummy gate dielectric 132 may be formed only on the exposed surfaces of the semiconductor fins 110A and 110B. That is, the surface of the isolation structure 105 is free from coverage of the dummy gate dielectric 132. In some embodiments, the patterned masks 135 may include a first layer 135A made of silicon oxynitride or silicon nitride and a second layer 135B made of silicon oxide.

A spacer layer 141 is formed conformally over the substrate 100. In some embodiments, the spacer layer 141 at least extends exposed surfaces of the patterned masks 135, the dummy gate structures 130A and 130B, and the semiconductor fins 110A and 110B. The spacer layer 141 will be pattered in later steps, and the remaining portions of the spacer layer 141 will denote the spacer layers 141A and 141B as discussed in FIGS. 1A to 1C. In some embodiments, the spacer layer 141 may be formed by suitable deposition process, such as CVD, ALD, or the like.

After forming the spacer layer 141, an implantation process is performed to form lightly doped source and drain (LDD) regions 180 in the semiconductor fins 110A and 110B through the spacer layer 141. In some embodiments, the LDD regions 180 may include n-type impurities such as phosphorus (P), arsenic (As), or antimony (Sb), or p-type impurities such as boron (B), gallium (Ga), indium (In), aluminium (Al). In some embodiments, after the implantation process, an annealing may be performed, and the diffusion of impurities may cause LDD regions 180 extend under the vertical portions of the spacer layer 141. In some embodiments, the spacer layer 141 may include impurities the same as the LDD regions 180. In some embodiments, the spacer layer 141 may include higher impurities concentration than spacer layers formed in layer steps (e.g., the spacer layers 142, 143, 144, and 145).

Figure 3A:
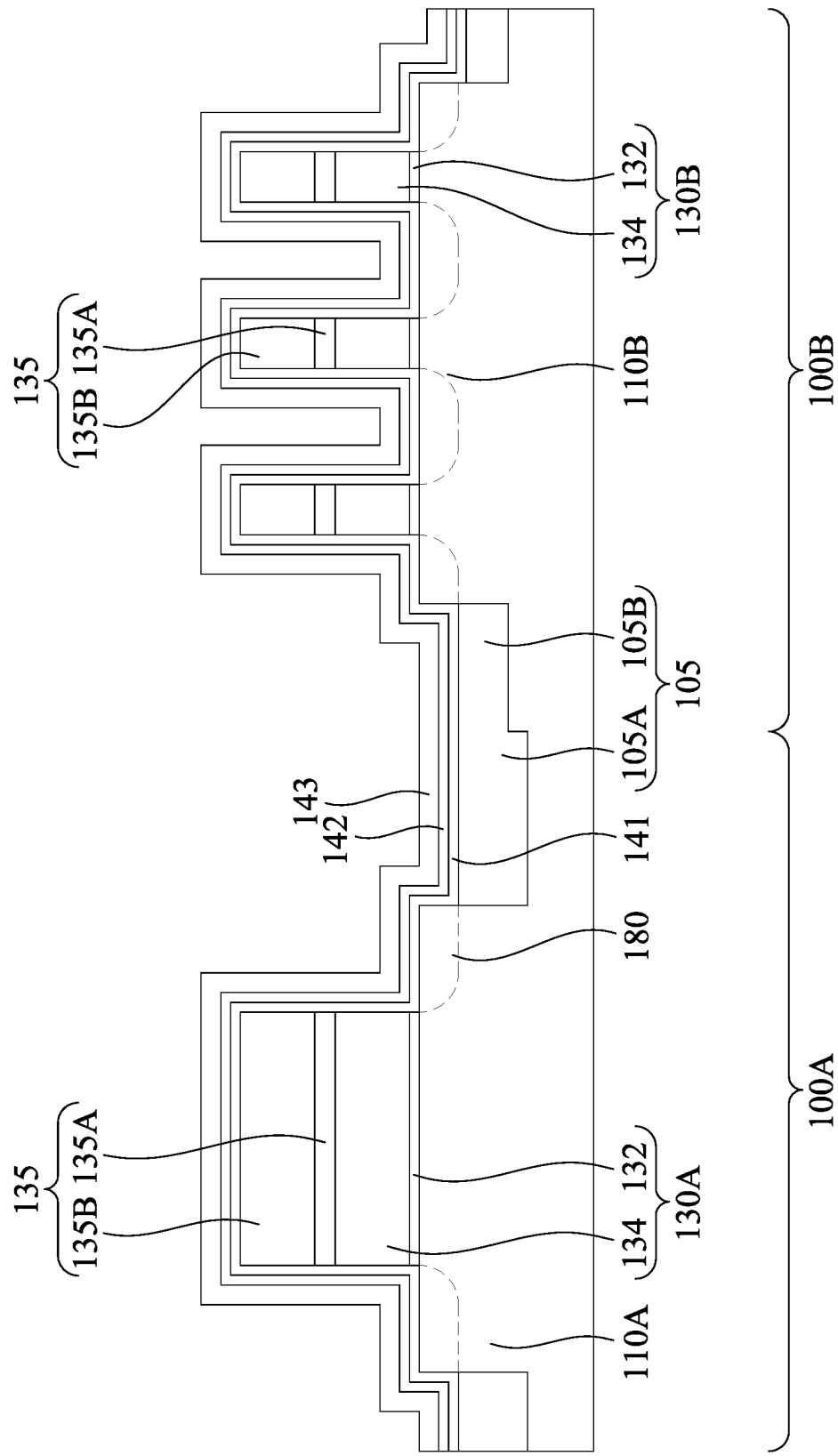
Figure 3B:
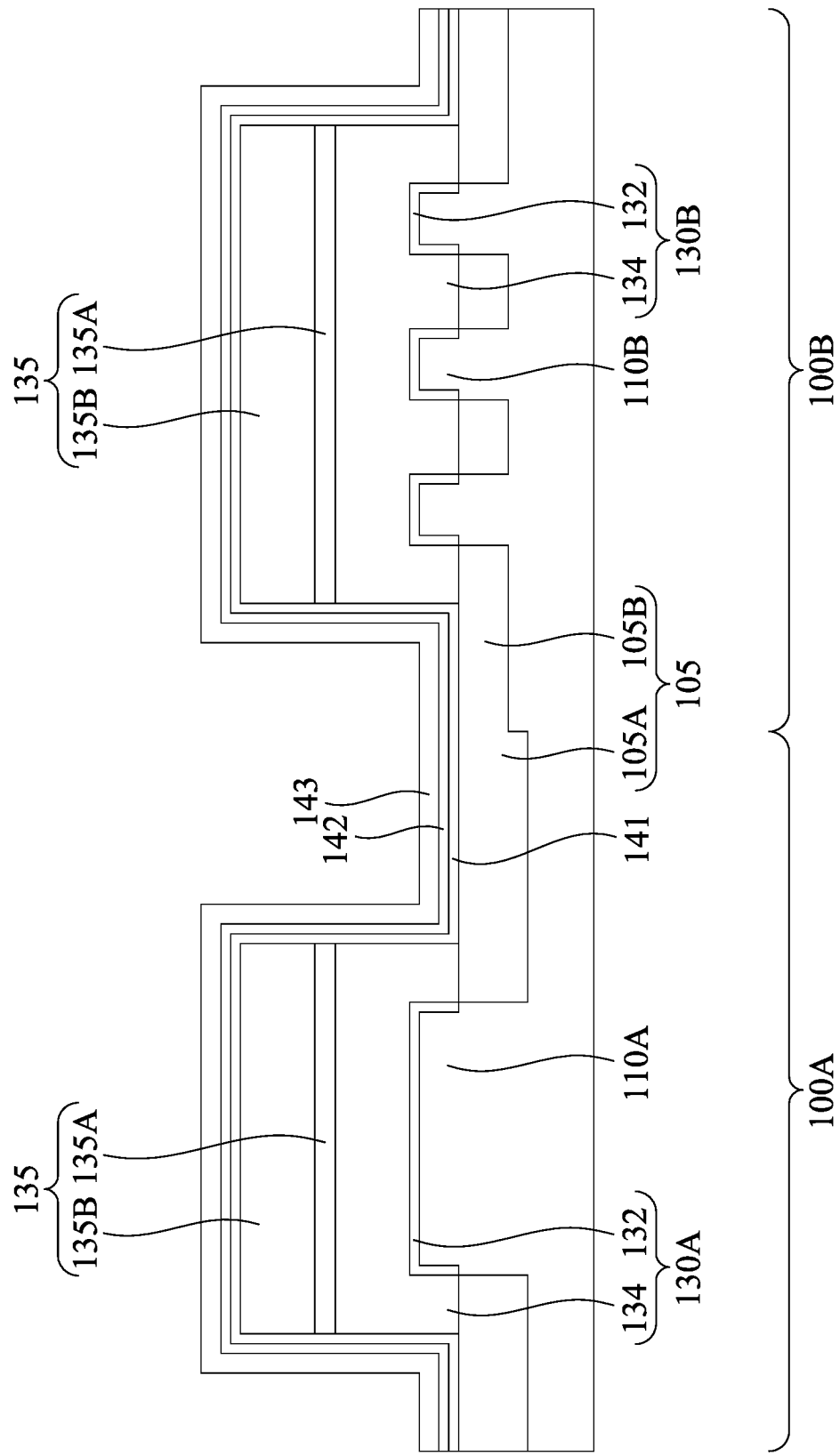

Reference is made to FIGS. 3A and 3B. A spacer layer 142 and a spacer layer 143 are formed conformally over the substrate 100. In some embodiments, the spacer layer 142 may be made of silicon oxide, which provides sufficient etching selectivity to the spacer layers 141 and 143. In some embodiments, the spacer layer 143 may be made of silicon nitride. In some embodiments, the spacer layers 142 and 143 may be formed by suitable deposition process, such as CVD, ALD, or the like. The spacer layers 142 and 143 will be patterned in later steps, and the remaining portions of the spacer layers 142 and 143 will denote the spacer layers 142A and 143A as discussed in FIGS. 1A to 1C.

Figure 4A:
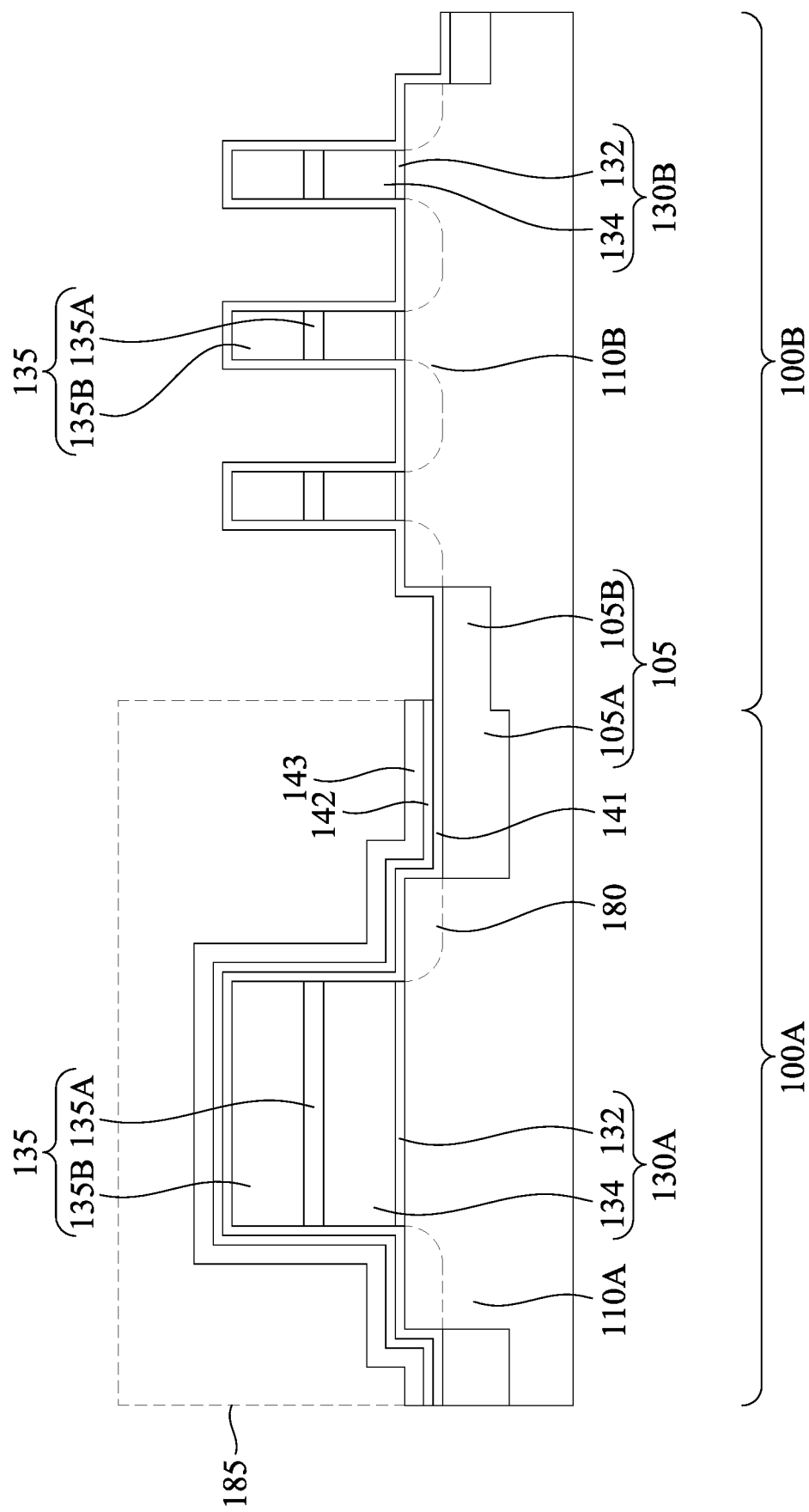
Figure 4B:
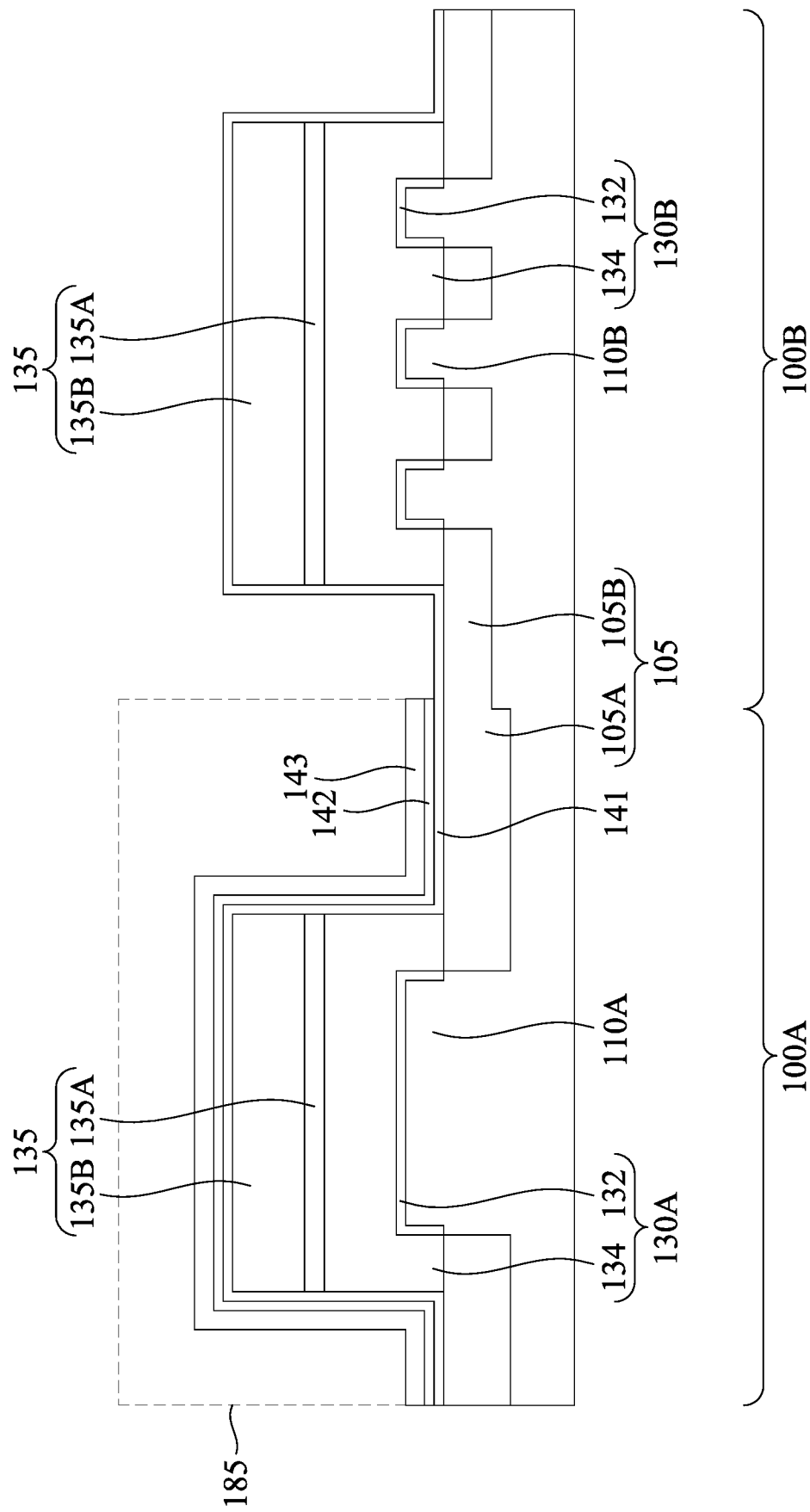

Reference is made to FIGS. 4A and 4B. A mask layer 185 is formed over the substrate 100, and substantially covers the I/O region 100A of the substrate 100. In greater detail, the mask layer 185 is formed covering the semiconductor fin 110A and the dummy gate structure 130A, while leaving the semiconductor fin 110B and the dummy gate structure 130B within the core region 100B of the substrate 100 uncovered by the mask layer 185. In some embodiments, the mask layer 185 may be photoresist, and may be patterned using photolithography process.

Next, the spacer layers 142 and 143 exposed by the mask layer 185 are removed. In some embodiments, the spacer layers 142 and 143 by suitable process, such as a wet etch, a dry etch, or combinations thereof. In some embodiments, an etching process is first performed to remove the spacer layer 143, and then another etching process is performed to remove the spacer layer 142. As mentioned above, the spacer layer 142 may provide sufficient etching selectivity to the spacer layers 141 and 143. Accordingly, the spacer layer 142 can act as an etching stop layer during etching the spacer layer 143, and the spacer layer 141 can keep substantially intact after etching away the spacer layer 142.

Figure 5A:
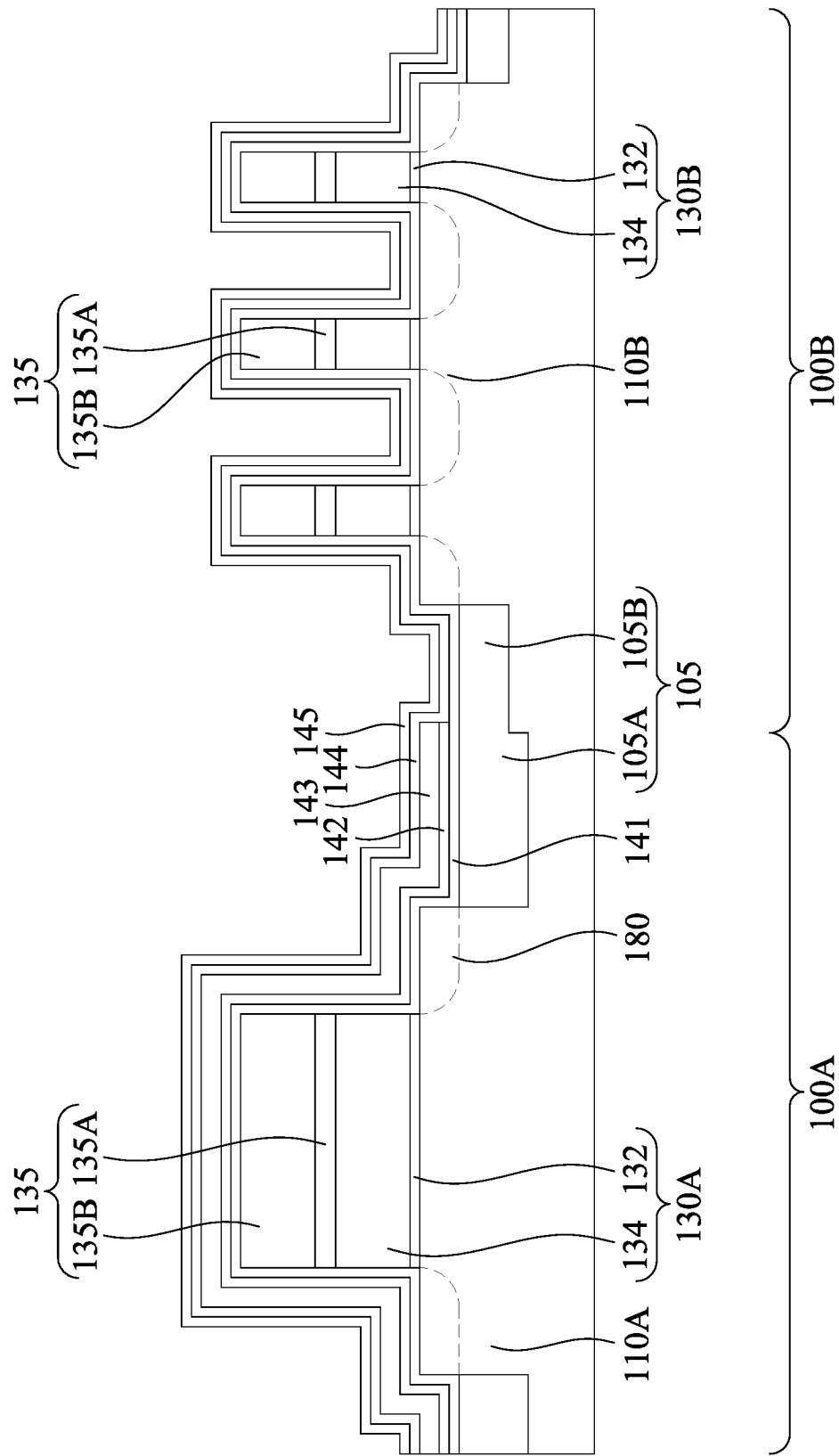
Figure 5B:
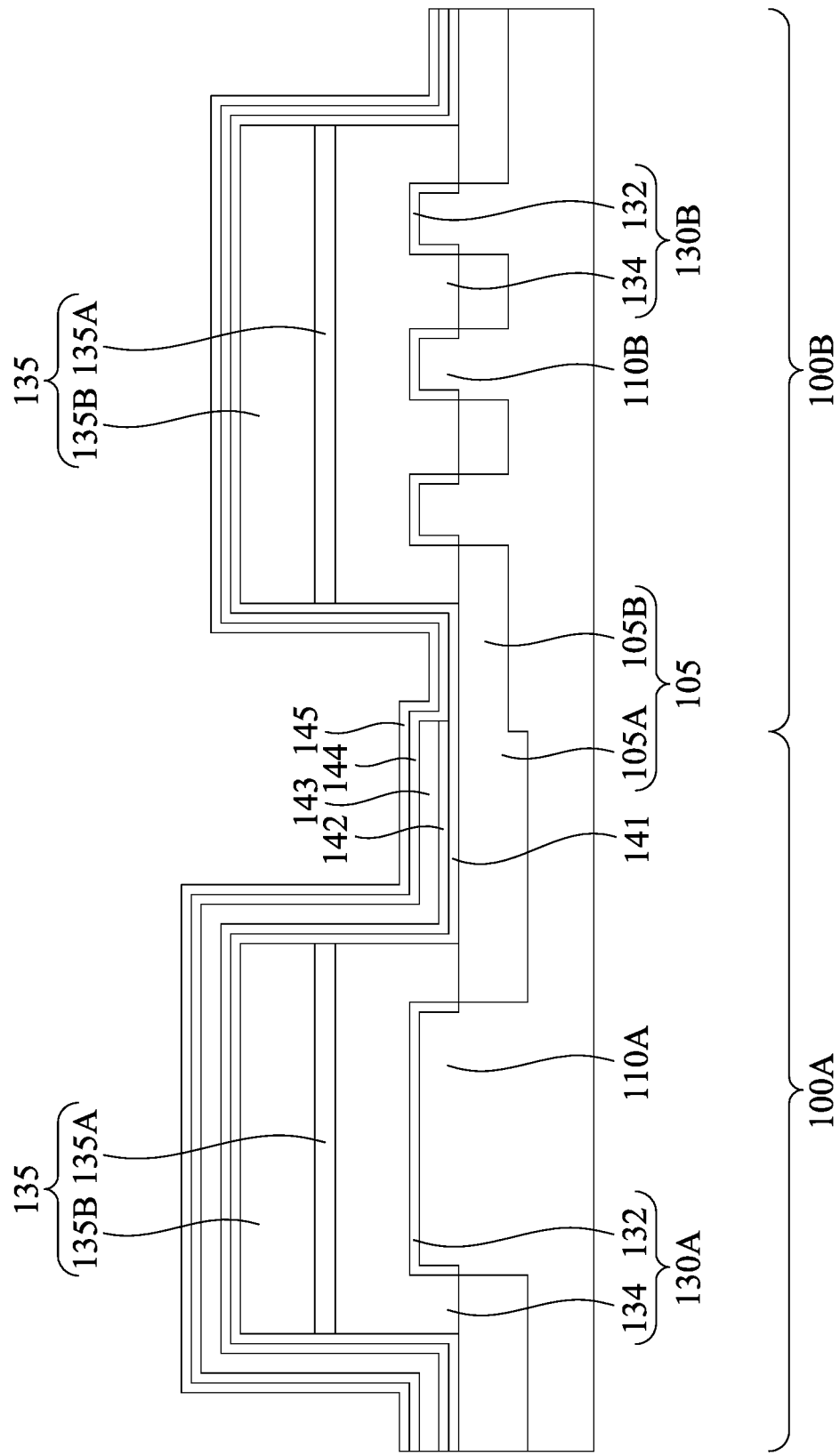

Reference is made to FIGS. 5A and 5B. The mask layer 185 is removed, and spacer layers 144 and 145 are formed conformally over the substrate 100. In some embodiments, as the portions of the spacer layers 142 and 143 within the core region 100B are removed, the portion of the spacer layer 144 within the core region 100B is formed in contact with the portion of the spacer layer 141, which results in that the portions of the spacer layers 144 and 145 directly above the isolation structure 105 has stepped bottom surface. Stated another way, bottom surfaces of the spacer layers 144 and 145 within the core regions 100B are lower than bottom surfaces of the spacer layers 144 and 145 within the I/O region 100A. The bottommost surfaces of the spacer layers 144 and 145 are directly above the second portion 105B of the isolation structure 105. In some embodiments, the spacer layer 144 is in contact with ends of the remaining spacer layers 142 and 143.

In some embodiments, the spacer layer 144 may be made of silicon oxycarbonitride (SiOCN), silicon oxycarbide (SiOC), or silicon carbide (SiC). In some embodiments, the spacer layer 145 may be made of silicon nitride. In some embodiments, the spacer layers 144 and 145 may be formed by suitable deposition process, such as CVD, ALD, or the like. The spacer layers 144 and 145 will be patterned in later steps, and the remaining portions of the spacer layers 144 and 145 will denote the spacer layers 144A/144B and spacer layers 145A/145B as discussed in FIGS. 1A to 1C.

Figure 6A:
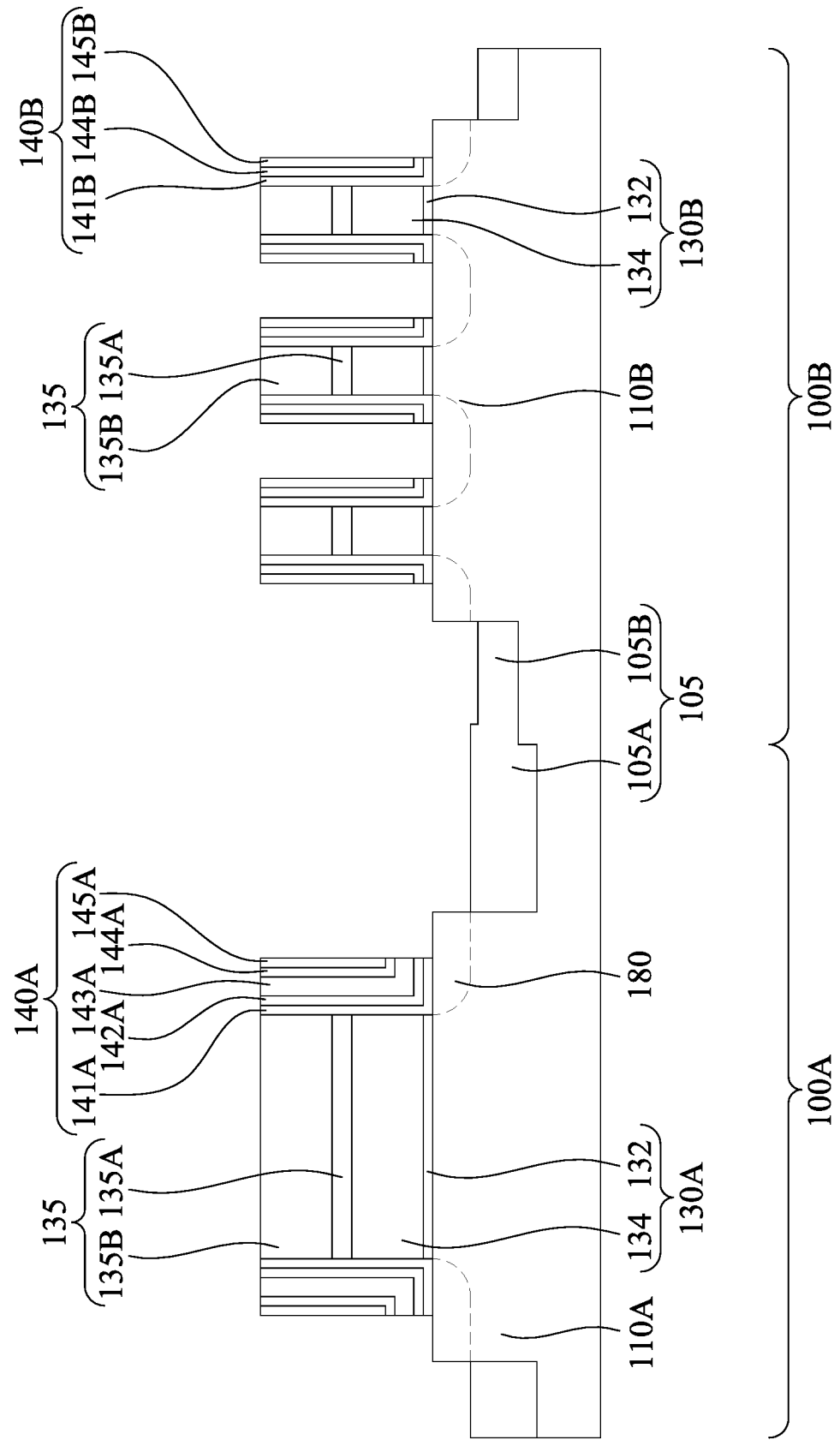
Figure 6B:
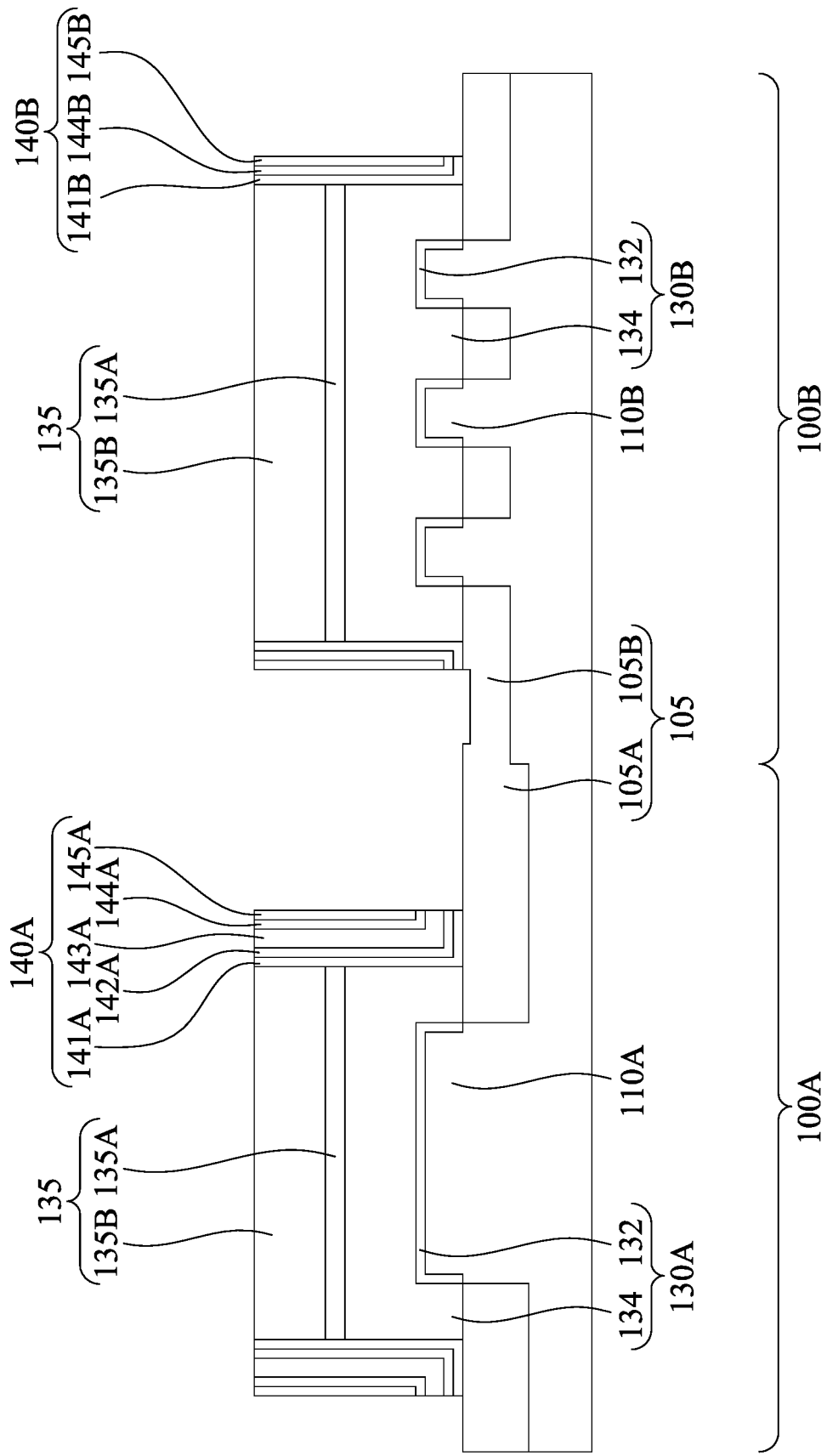

Reference is made to FIGS. 6A and 6B. The spacer layers 141, 142, 143, 144, and 145 are patterned to form gate spacers 140A and 140B. In greater details, the remaining portions of the spacer layers 141, 142, 143, 144, and 145 within the I/O region 100A contribute the gate spacers 140A, and may be labeled as spacer layers 141A, 142A, 143A, 144A, and 145A. The remaining portions of the spacer layers 141, 144, and 145 within the core region 100B contribute the gate spacers 140B, and may be labeled as spacer layers 141B, 144B, and 145B.

In some embodiments, the spacer layers 141, 142, 143, 144, and 145 may be patterned by using suitable etching process, such as an anisotropic etching process, to remove horizontal portions of the spacer layers 141, 142, 143, 144, and 145, while leaving vertical portions of the spacer layers 141, 142, 143, 144, and 145 remaining on sidewalls of the dummy gate structures 130A and 130B. For example, the patterning process may include several etching processes to etch, layer by layer, the spacer layers 141, 142, 143, 144, and 145. For example, a first etching process and a second etching process may be performed to respectively etch the spacer layers 144 and 145 to expose the portion of the spacer layer 143 within the I/O region 100A and the portion of the spacer layer 141 within the core region 100B. As the spacer layers 141 and 143 are made of the same material, a third etching process may be performed to etch the spacer layers 141 and 143 to expose the portion of the spacer layer 142 within the I/O region 100A and the second portion 105B of the isolation structure 105 within the core region 100B. Next, a fourth etching process is performed to etch the spacer layer 142, and because the spacer layer 142 and the isolation structure 105 may be made of the same material (e.g., $SiO_2$), the top surface of the second portion 105B of the isolation structure 105 may be slightly pulled back during etching the spacer layer 142. Afterward, a fifth etching process is performed to etch the spacer layer 141 within the I/O region 100A.

Figure 7A:
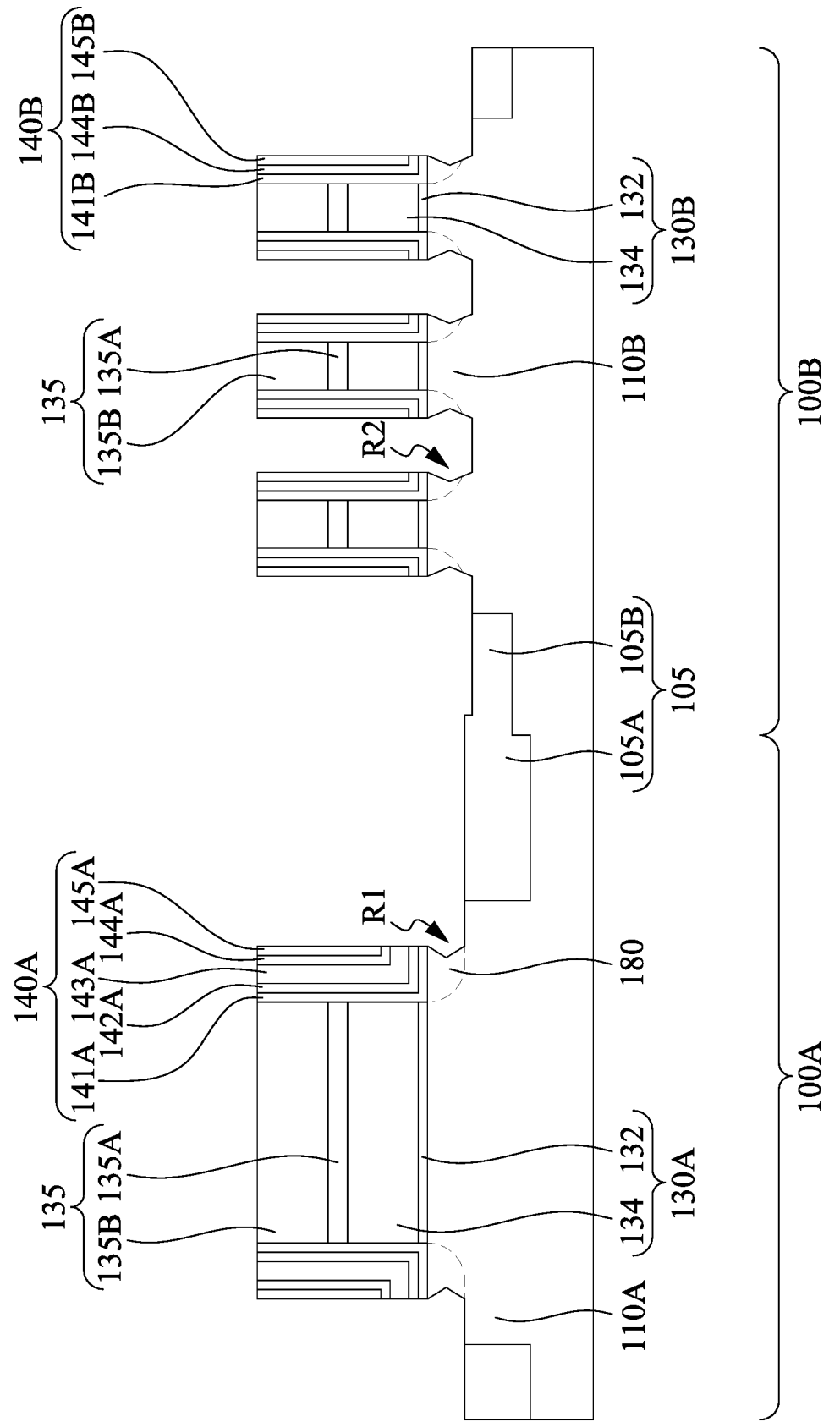
Figure 7B:
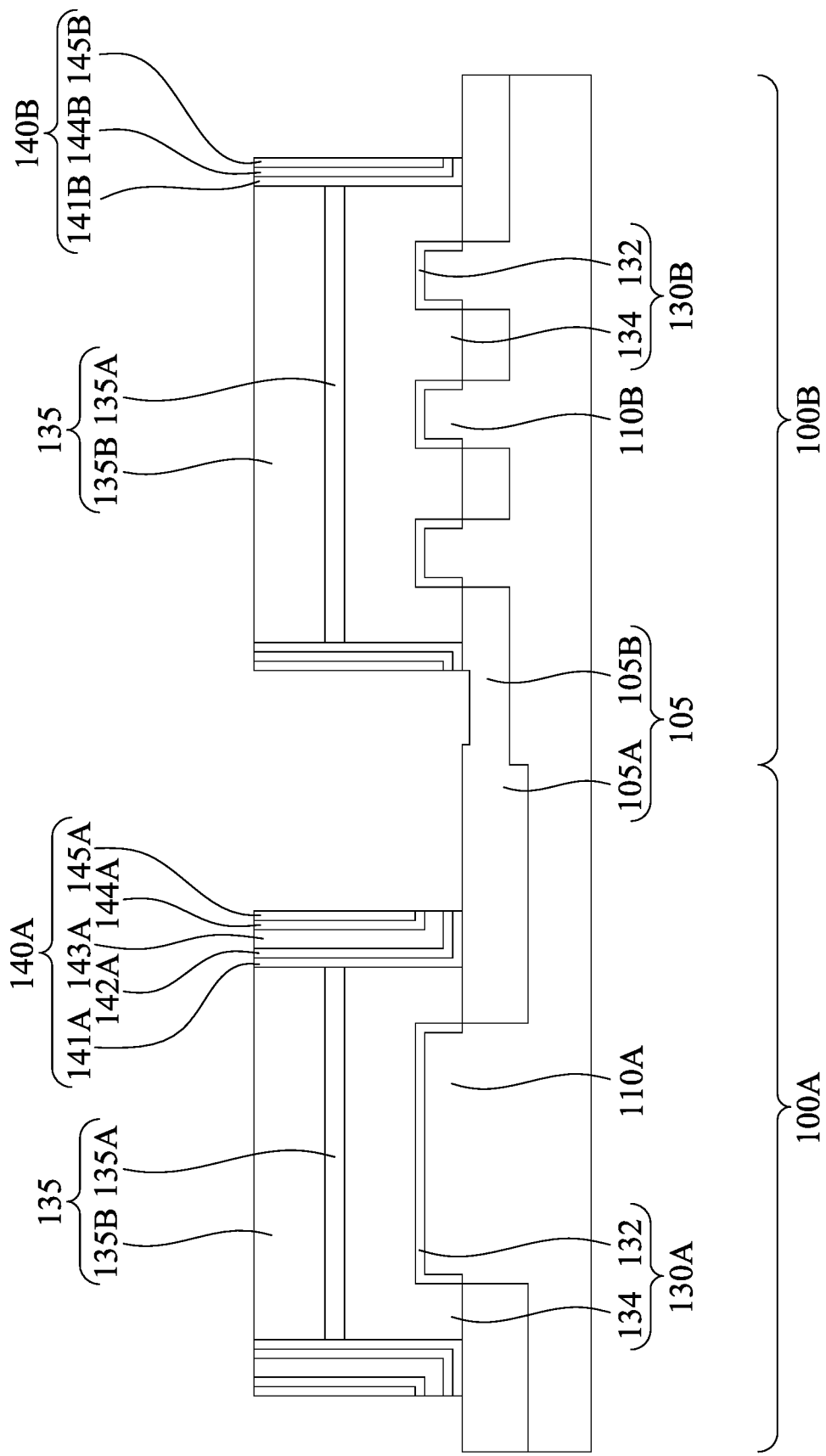

Reference is made to FIGS. 7A and 7B. Recesses R1 and R2 are formed in the semiconductor fins 110A and 110B, respectively. In some embodiments, the recesses R1 and R2 may be formed by etching exposed surfaces of the semiconductor fins 110A and 110B that are not covered by the dummy gate structures 130A, 130B and the gate spacers 140A, 140B.

Figure 8A:
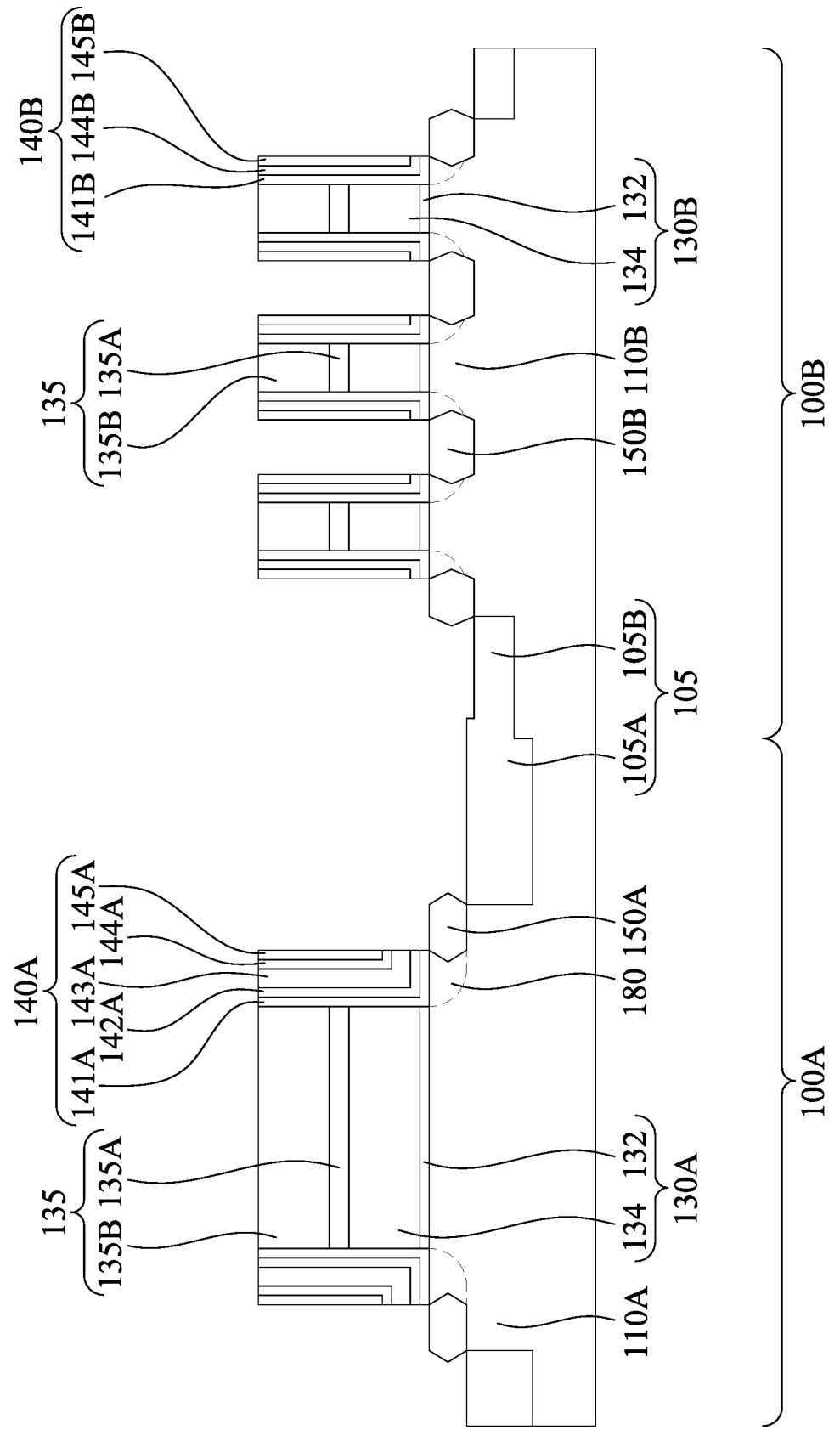
Figure 8B:
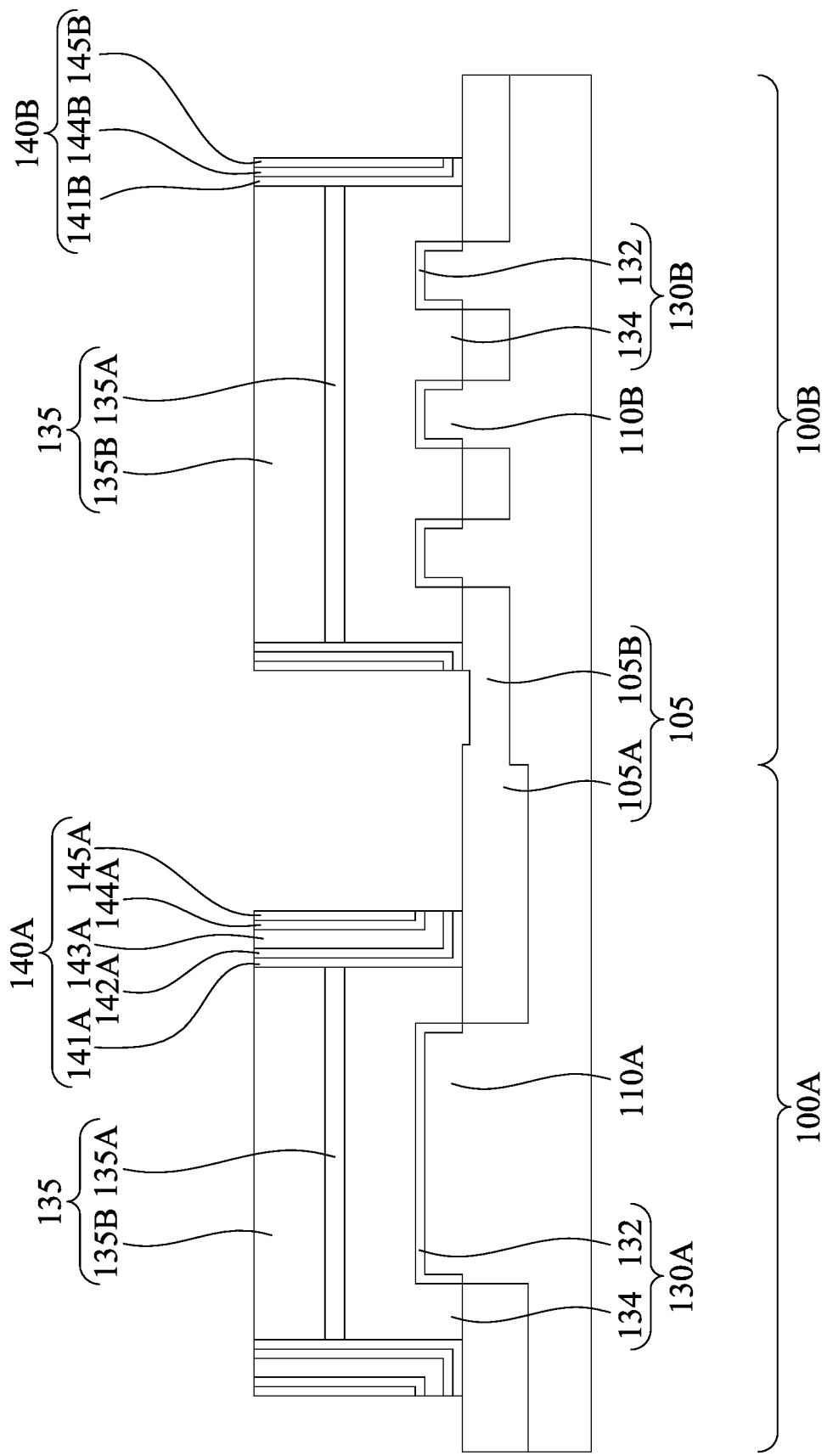

Reference is made to FIGS. 8A and 8B. Epitaxial source/drain structures 150A and 150B are formed in the recesses R1 and R2, respectively. In some embodiments, the epitaxial source/drain structures 150A and 150B may be formed by depositing a crystalline semiconductor material in the recesses R1 and R2 by a selective epitaxial growth (SEG) process. In some other embodiments, the epitaxial source/drain structures 150A and 150B may fill the recesses R1 and R2 and may extend further beyond the original surface of the semiconductor fins 110A and 110B to form raised source/drain epitaxy structures in some embodiments. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. In some embodiments, the epitaxial source/drain structures 150A and 150B may be in-situ doped.

Figure 9A:
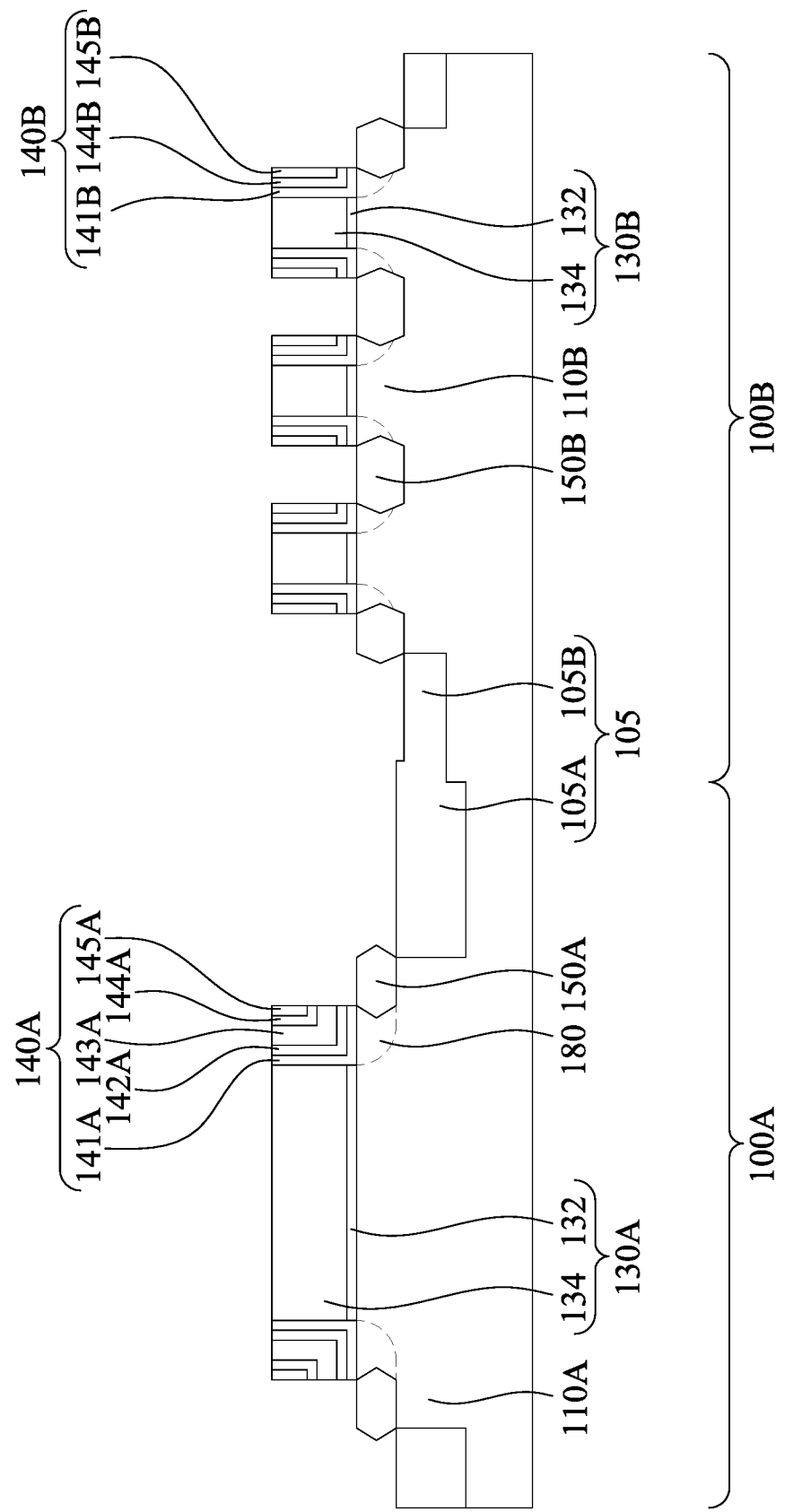
Figure 9B:
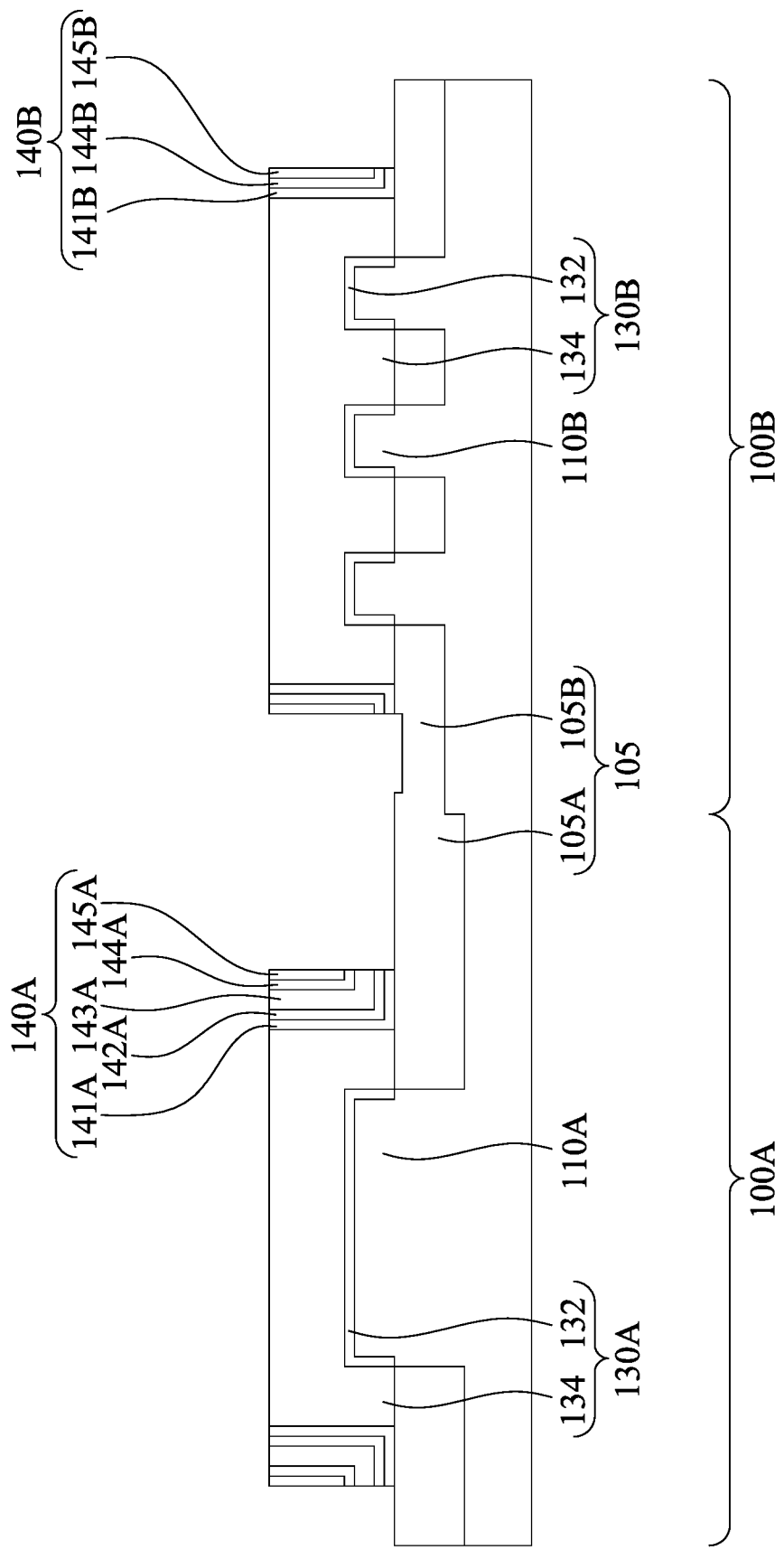

Reference is made to FIGS. 9A and 9B. The patterned masks 135 and the gate spacers 140A and 140 are etched back to expose the dummy gate structures 130A and 130B. In some embodiments, the patterned masks 135 and the gate spacers 140A and 140 may be etched back by, for example, depositing a mask layer (not shown) over the substrate 100 and filling spacers around the dummy gate structures 130A and 130B. In some embodiments, the mask layer may be a bottom anti-reflectance coating (BARC) layer, which may be formed of an organic or inorganic material. Next, an etching process, which has a lower selectivity to the patterned masks 135, the gate spacers 140A and 140B, may be performed to remove the patterned masks 135 and top portions of the gate spacers 140A and 140B. Afterward, the mask layer may be removed, such as by stripping.

Figure 10A:
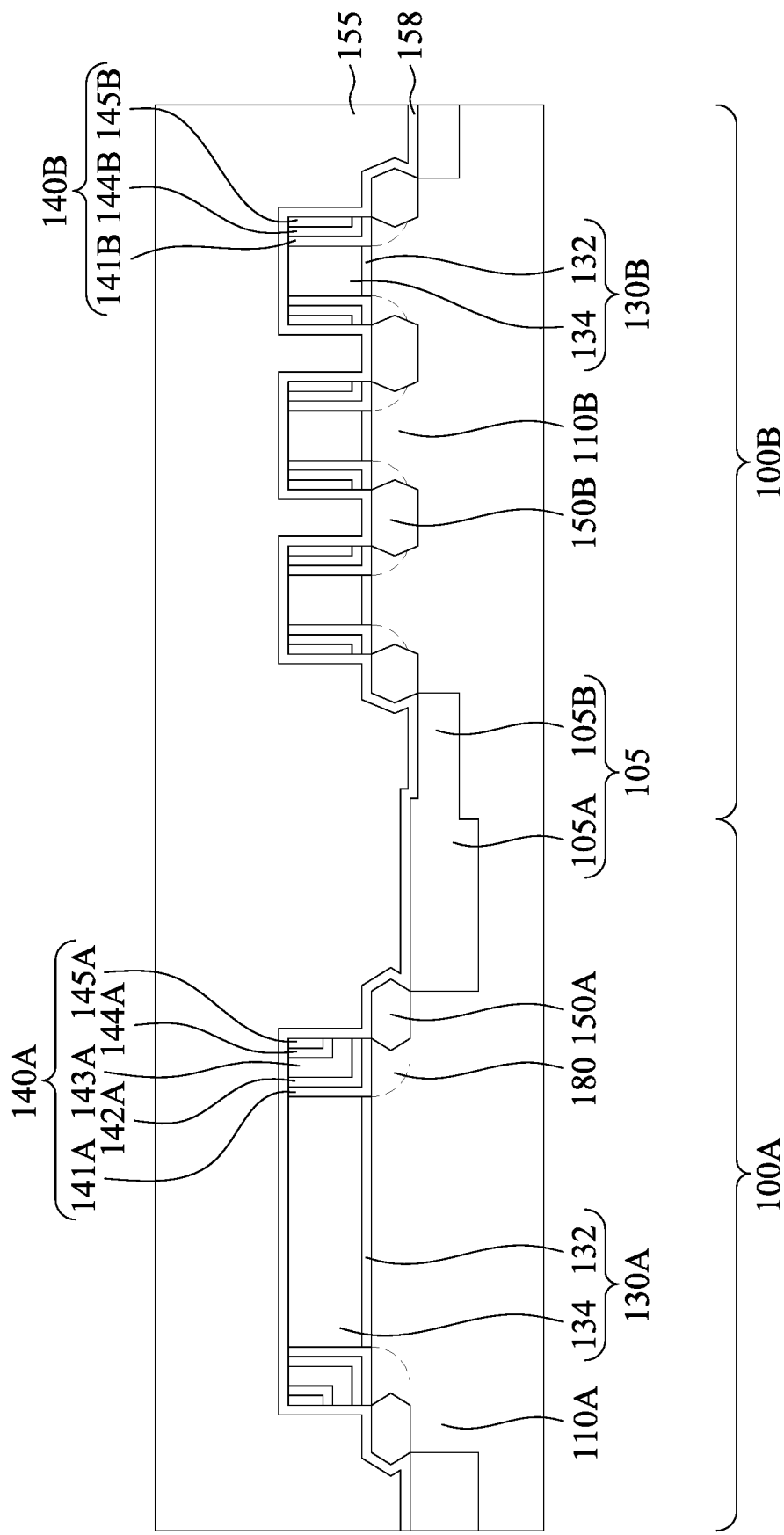
Figure 10B:
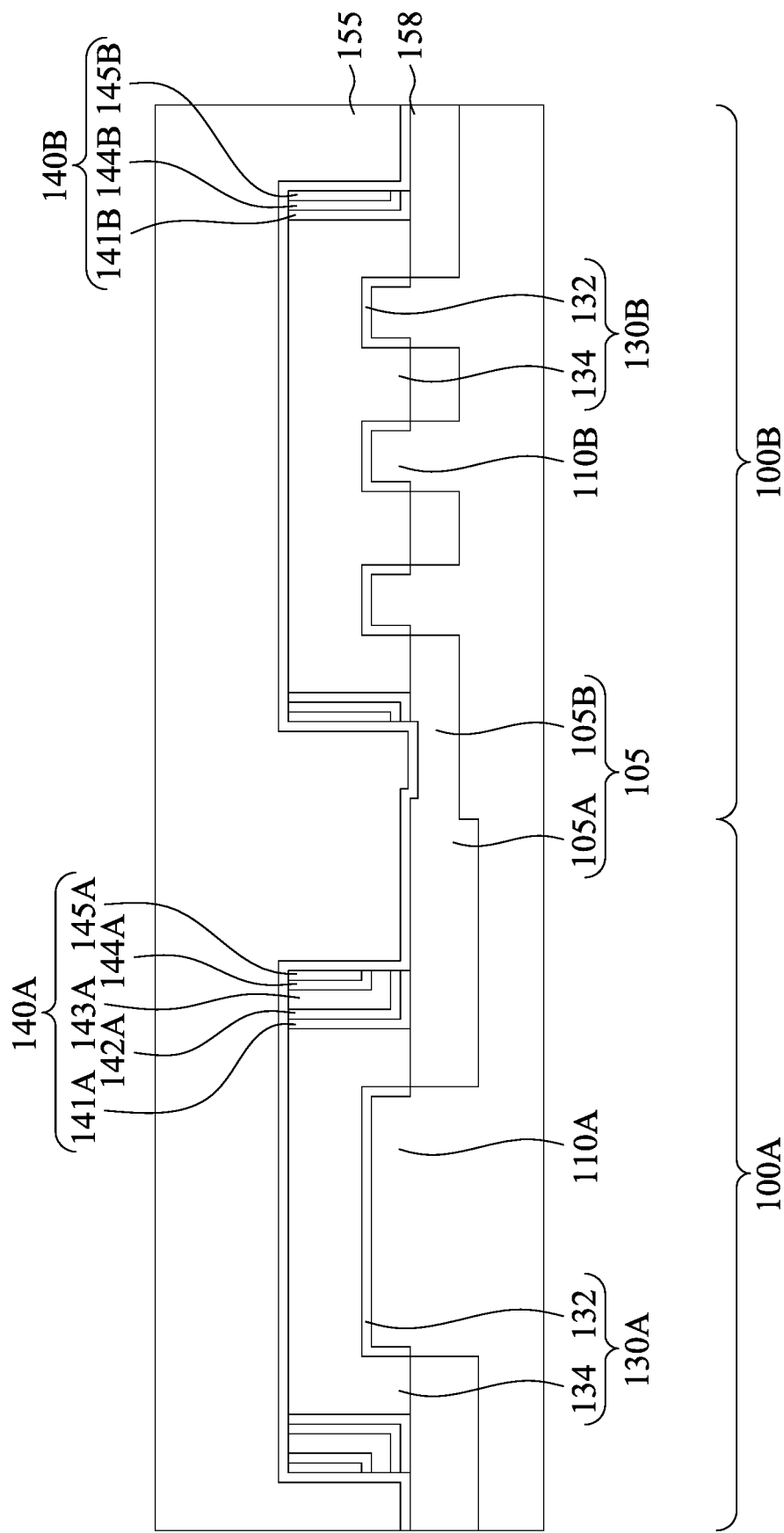

Reference is made to FIGS. 10A and 10B. A CESL 158 and a first ILD 155 are deposited over the substrate 100. The first ILD 155 may be formed of a dielectric material, and may be deposited by any suitable method, such as CVD, plasma-enhanced CVD (PECVD), or FCVD. The CESL 158 may be deposited by PECVD, sub atmospheric chemical vapor deposition (SACVD), low pressure chemical vapor deposition (LPCVD), ALD, HDPCVD, plasma enhanced atomic layer deposition (PEALD), molecular layer deposition (MLD) or plasma impulse chemical vapor deposition (PICVD).

Figure 11A:
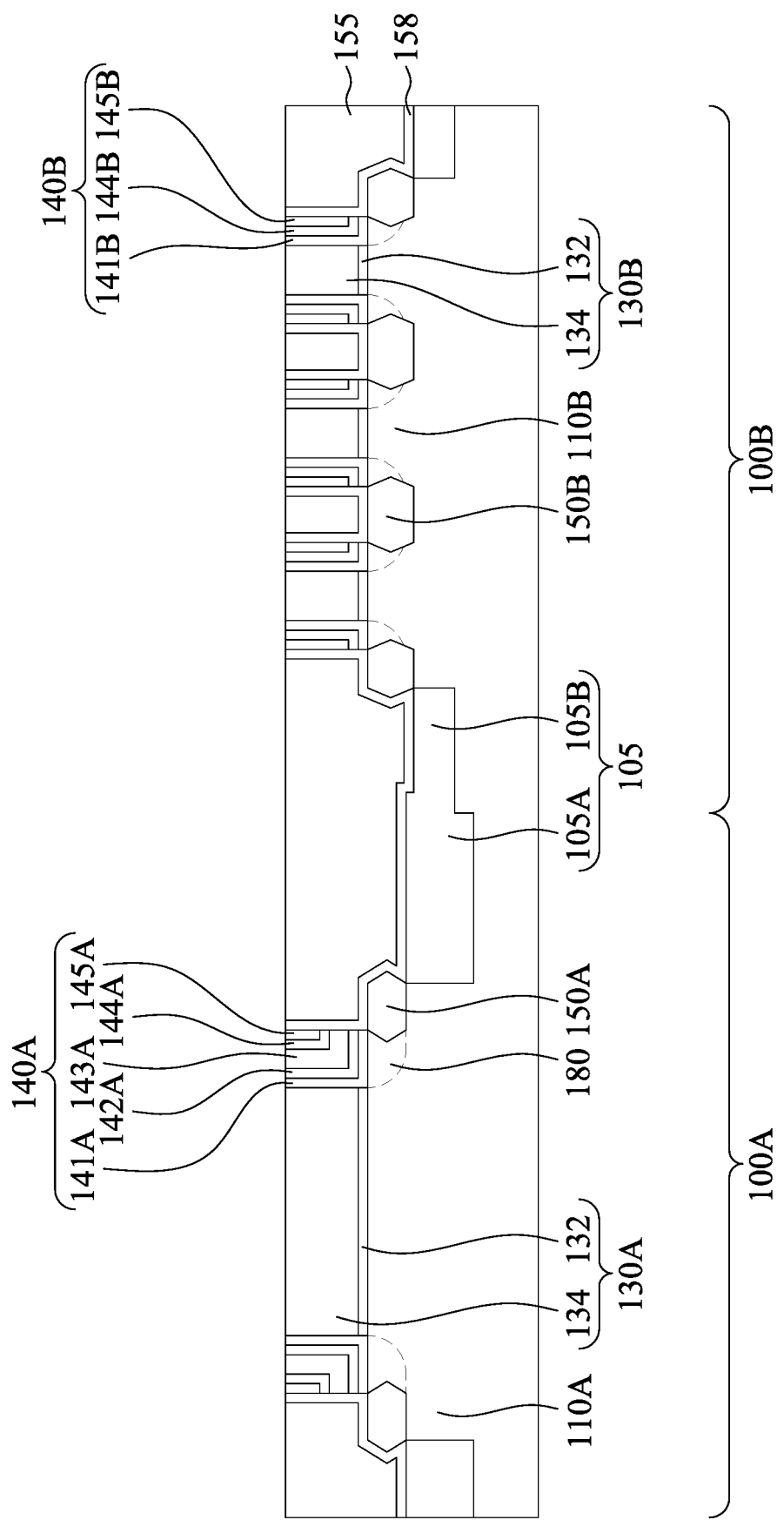
Figure 11B:
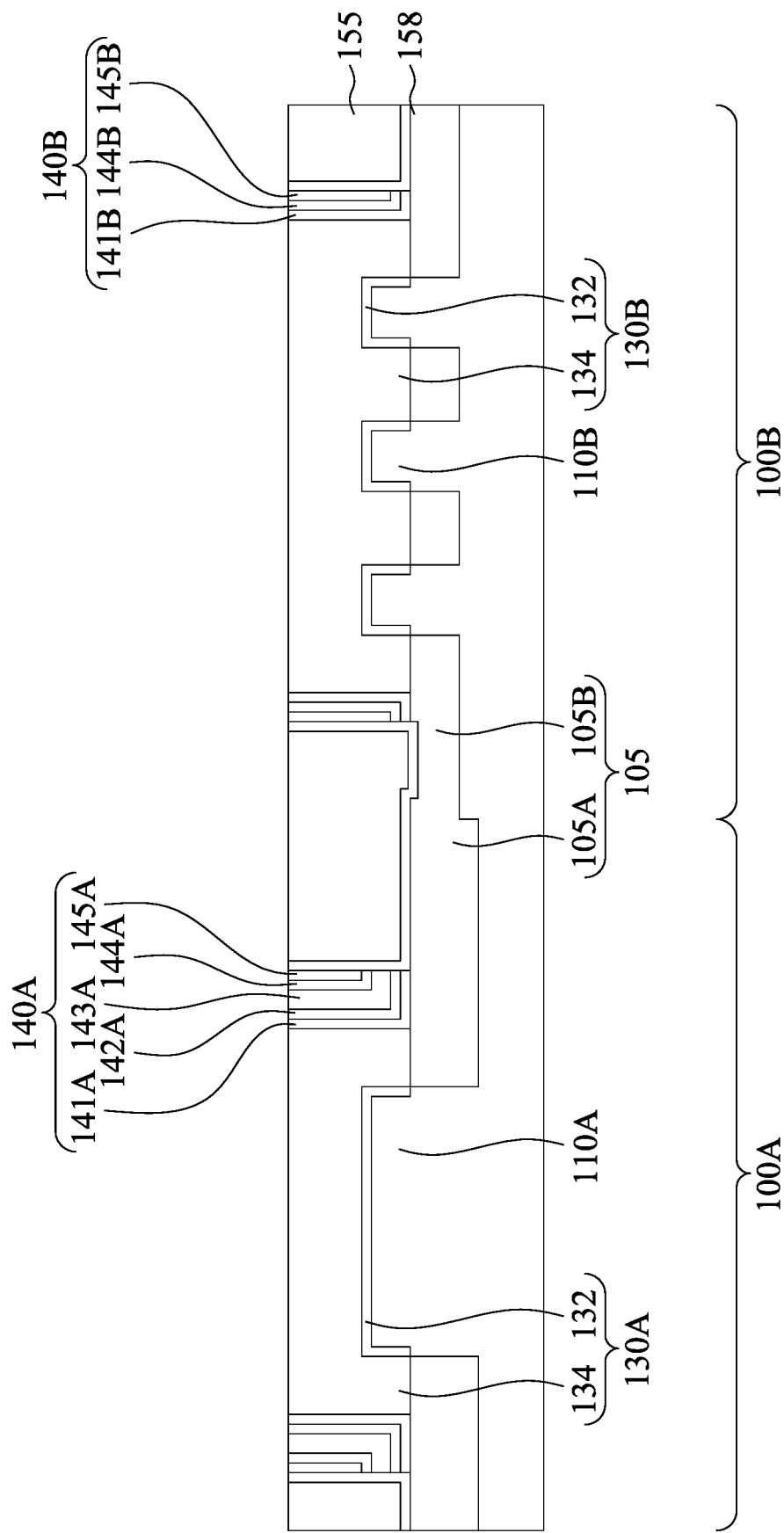

Reference is made to FIGS. 11A and 11B. A planarization process, such as a CMP process, is performed to remove excess materials of the CESL 158 and the first ILD 155 until the dummy gate structures 130A and 130B are exposed.

Figure 12A:
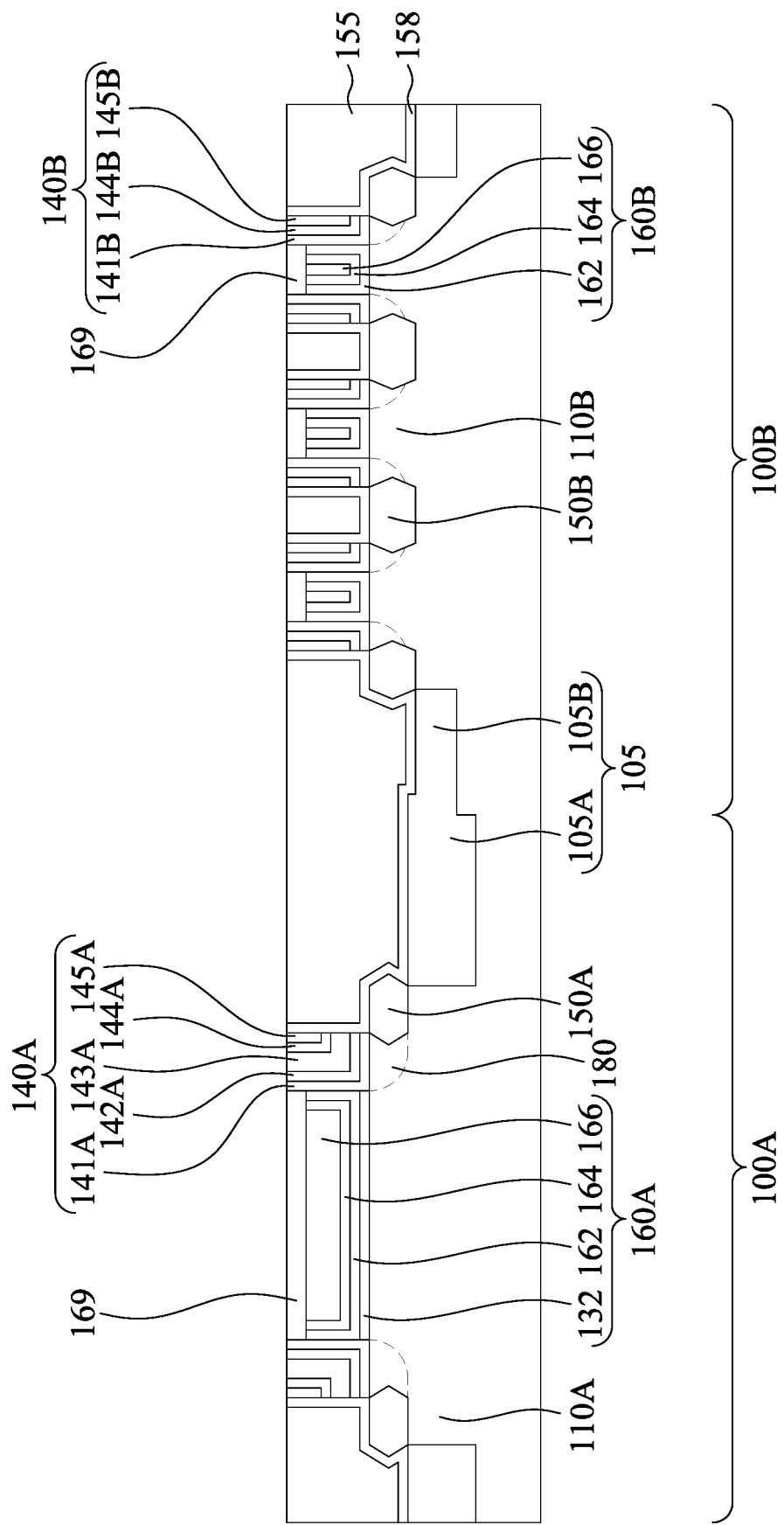
Figure 12B:
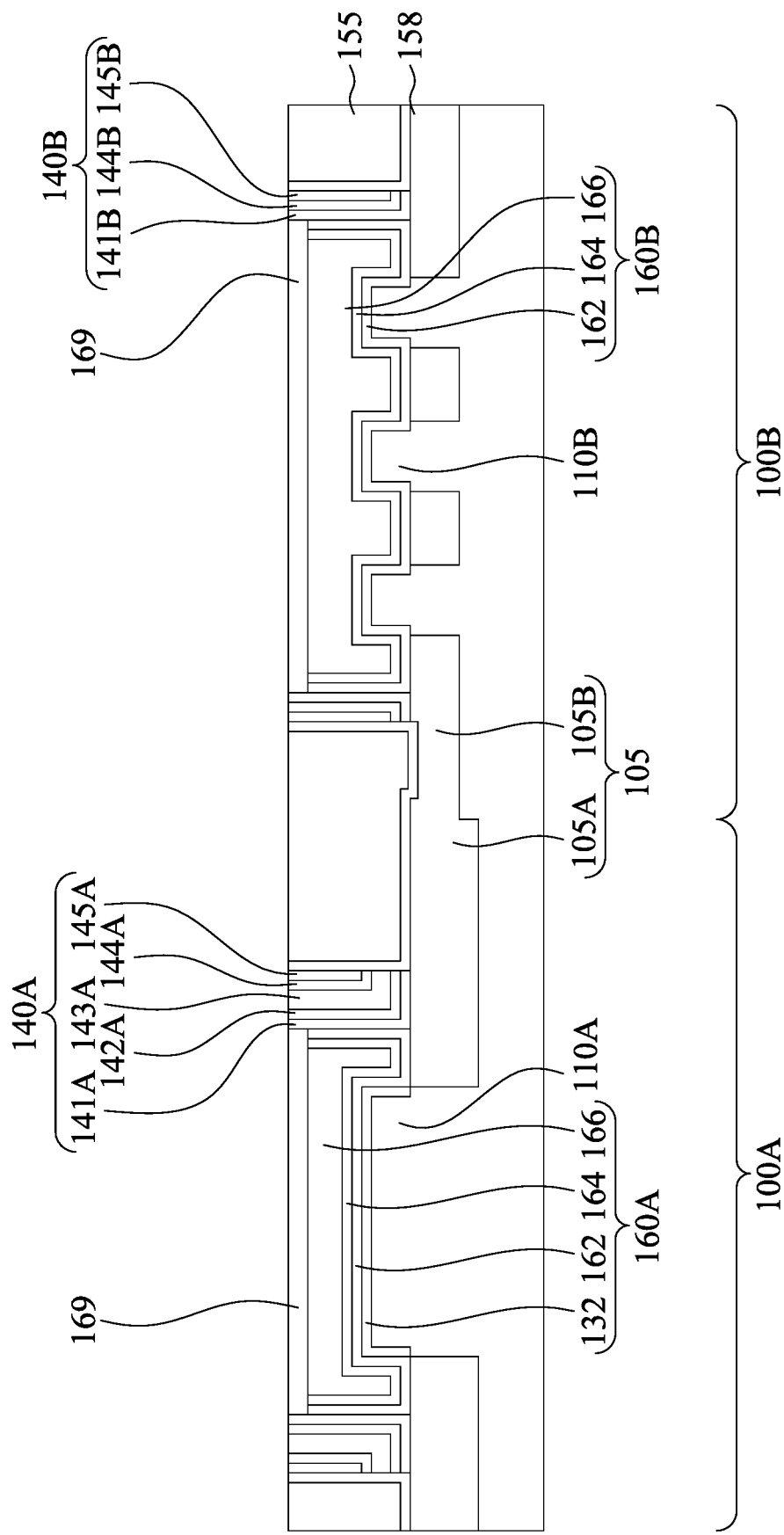

Reference is made to FIGS. 12A and 12B. The dummy gate structures 130A and 130B are replaced with gate structures 160A and 160B, respectively. In some embodiments, the dummy gate structures 130A and 130B may be removed by etching process to form gate trenches. Next, gate dielectric layers 162, work function metal layers 164, and filling metals 166 are deposited in the trenches for replacement gates. Afterwards, a planarization process, such as a CMP process, is performed to remove excess materials of the gate dielectric layer 162, the work function metal layer 164, and the filling metal 166 until the first ILD 155 is exposed. In some embodiments, the dummy gate dielectric 132 of the dummy gate structure 130A within the I/O region 100A is not removed, and thus the remaining dummy gate dielectric 132 contribute a portion of the gate structure 160A.

After the gate structures 160A and 160B are formed, the gate structures 160A and 160B may be etched back, such that top surfaces of the gate structures 160A and 160B are lowered. Next, capping layers 169 are formed over the gate structures 160A and 160B. In some embodiments, the capping layers 169 may be formed by, for example, depositing a dielectric material over the substrate 100 and filling the spaces between the gate spacers 140A and between the gate spacers 140B, and then performing a CMP process to remove excess dielectric material until the first ILD 155 is exposed.

Figure 13A:
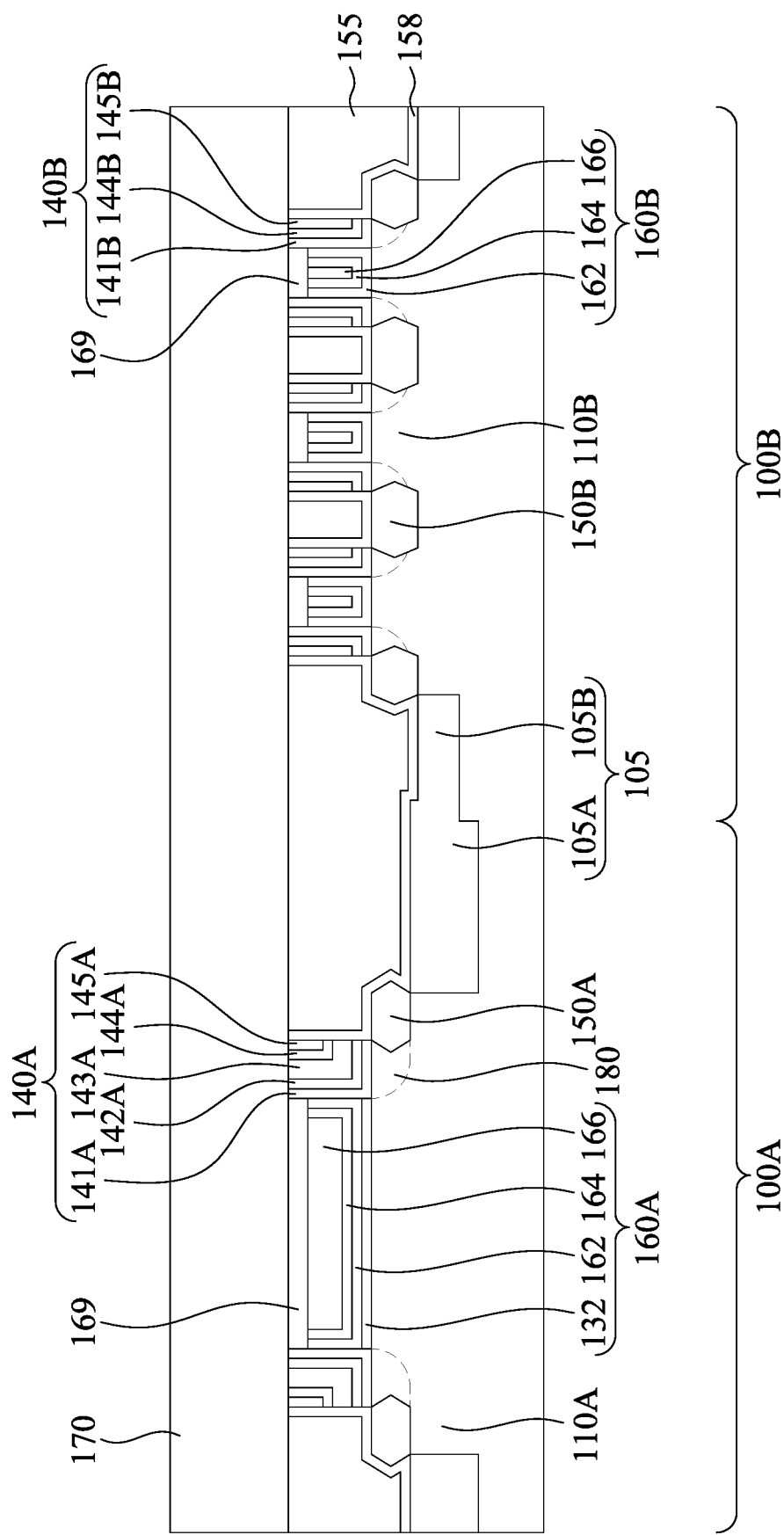
Figure 13B:
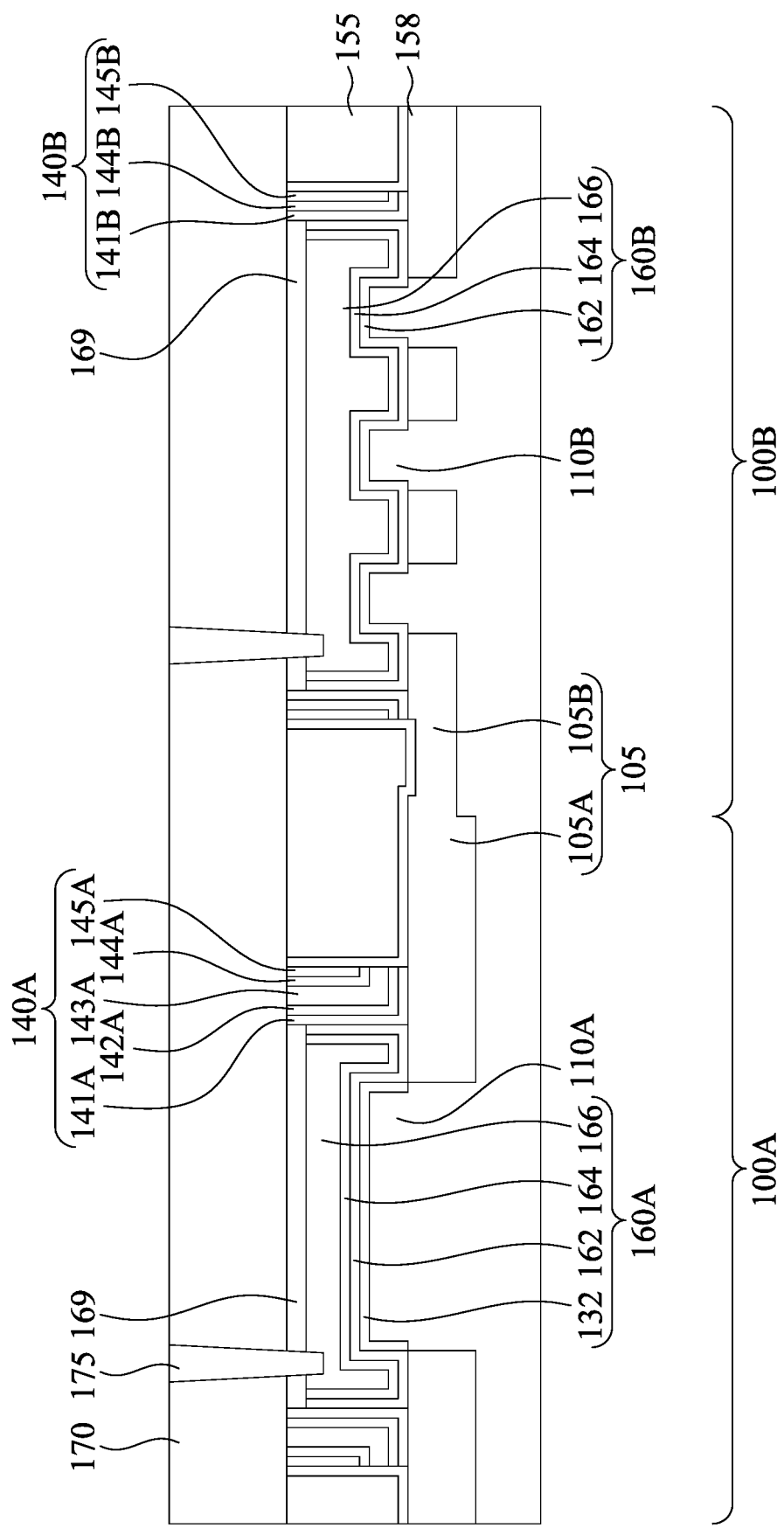

Reference is made to FIGS. 13A and 13B, a second ILD 170 is formed over the first ILD 155, and gate contacts 175 are formed extending through the second ILD 170 to the gate structures 160A and 160B (see FIG. 13B), respectively. In some embodiments, gate contacts 175 may be formed by, for example, patterning the second ILD 170 and the capping layers 169 to form openings, depositing one or more conductive materials in the openings, and performing a CMP process to remove excess conductive materials until the top surface of the second ILD 170 is exposed. In some embodiments, an etch stop layer (not shown) may be formed between the first ILD 155 and the second ILD 170.

FIG. 14 illustrates a method M1 of forming a semiconductor device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At step S101, first and second semiconductor fins are formed over an I/O region and a core region of a substrate, first and second dummy gate structures are formed over the first and second semiconductor fins, and a first spacer layer is formed over the substrate. FIGS. 2A and 2B illustrate cross-sectional views of some embodiments corresponding to act in step S101.

At step S102, second and third spacer layers are formed over the substrate. FIGS. 3A and 3B illustrate cross-sectional views of some embodiments corresponding to act in step S102.

At step S103, the second and third spacer layers within the core region are removed. FIGS. 4A and 4B illustrate cross-sectional views of some embodiments corresponding to act in step S103.

At step S104, the fourth and fifth spacer layers are formed over the substrate. FIGS. 5A and 5B illustrate cross-sectional views of some embodiments corresponding to act in step S104.

At step S105, the first, second, third, fourth, and fifth spacer layers are patterned to form first and second gate spacers. FIGS. 6A and 6B illustrate cross-sectional views of some embodiments corresponding to act in step S105.

At step S106, recesses are formed in the first and second semiconductor fins. FIGS. 7A and 7B illustrate cross-sectional views of some embodiments corresponding to act in step S106.

At step S107, epitaxial source/drain structures are formed in the recesses. FIGS. 8A and 8B illustrate cross-sectional views of some embodiments corresponding to act in step S107.

At step S108, patterned masks over the first and second dummy gate structures and the first and second gate spacers are etched back. FIGS. 9A and 9B illustrate cross-sectional views of some embodiments corresponding to act in step S108.

At step S109, a CESL and a first ILD are formed. FIGS. 10A and 10B illustrate cross-sectional views of some embodiments corresponding to act in step S109.

At step S110, a planarization process is performed. FIGS. 11A and 11B illustrate cross-sectional views of some embodiments corresponding to act in step S110.

At step S111, the first and second dummy gate structures are replaced with first and second gate structures. FIGS. 12A and 12B illustrate cross-sectional views of some embodiments corresponding to act in step S111.

At step S112, a second ILD is formed over the first ILD, and contacts are formed. FIGS. 13A and 13B illustrate cross-sectional views of some embodiments corresponding to act in step S112.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that, a dual sidewall structure is formed in gate spacers within a high voltage device region (e.g., I/O region) of a substrate, so as to increase a thickness of the gate spacers. With this configuration, the hot current injection (HCI) reliability of the high voltage device may be improved, and thus the high voltage device may be performed under high voltage (e.g., over 2.5V) with prolonged lifetime.

In some embodiments of the present disclosure, a semiconductor device includes a substrate, a first semiconductor fin and a second semiconductor fin, a first gate structure and a second gate structure, a first gate spacer and a second gate spacer. The substrate includes a first region and a second region. The first semiconductor fin and the second semiconductor fin are over the first region and the second region of the substrate, respectively. The first gate structure and the second gate structure are over and cross the first semiconductor fin and the second semiconductor fin, respectively. The first gate spacer is disposed on a sidewall of the first gate structure, the first gate spacer including a first layer, a second layer over the first layer, a third layer over the second layer, a fourth layer over the third layer, and a fifth layer of the fourth layer, in which the first layer, the third layer, and the fifth layer of the first gate spacer are made of a same material. The second gate spacer is disposed on a sidewall of the second gate structure, the first gate spacer including a first layer, a second layer over the first layer, and a third layer over the second layer, in which the first layer and the third layer of the second gate spacer are made of a same material, and in which a lateral width of the first gate spacer is greater than a lateral width of the second gate spacer.

In some embodiments of the present disclosure, a semiconductor device includes a substrate, a first semiconductor fin and a second semiconductor fin, an isolation structure, a first gate structure and a second gate structure, a first gate spacer and a second gate spacer. The substrate includes a first region and a second region. The first semiconductor fin and the second semiconductor fin are over the first region and the second region of the substrate, respectively. The isolation structure is over the substrate and between the first semiconductor fin and the second semiconductor fin, the isolation structure including a first portion adjacent to the first semiconductor fin and a second portion adjacent to the second semiconductor fin, in which a top surface of the first portion is higher than a top surface of the second portion. The first gate structure and the second gate structure are over and cross the first semiconductor fin and the second semiconductor fin, respectively. The first gate spacer is disposed on a sidewall of the first gate structure. The second gate spacer disposed is on a sidewall of the second gate structure, in which the first gate spacer is wider than the second gate spacer.

In some embodiments of the present disclosure, a method includes forming a first semiconductor fin and a second semiconductor fin over a first region and a second region of a substrate, respectively; forming an isolation structure over the substrate and between the first semiconductor fin and the second semiconductor fin; forming a first dummy gate structure and a second dummy gate structure over the first semiconductor fin and the second semiconductor fin, respectively; forming a first, second, and third spacer layers over the substrate and covering the first and second dummy gate structures; forming a mask layer over the first region of the substrate and covering the first dummy gate structure, while leaving the second region of the substrate exposed; etching portions of the second and third spacer layers within the second region; removing the mask layer; forming fourth and fifth spacer layers over the substrate and covering the first and second dummy gate structures; and patterning the first, second, third, fourth, and fifth spacer layers to form a first gate spacer on a sidewall of the first dummy gate structure and a second gate spacer on a sidewall of the second dummy gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first semiconductor fin and a second semiconductor fin over a first region and a second region of a substrate, respectively;
    forming an isolation structure over the substrate and between the first semiconductor fin and the second semiconductor fin;
    forming a first dummy gate structure and a second dummy gate structure over the first semiconductor fin and the second semiconductor fin, respectively;
    forming a first, second, and third spacer layers over the substrate and covering the first and second dummy gate structures;
    forming a mask layer over the first region of the substrate and covering the first dummy gate structure, while leaving the second region of the substrate exposed;
    etching portions of the second and third spacer layers over the entire second region to remove an entirety of the portions of the second and third spacer layers over the entire second region;
    removing the mask layer;
    forming fourth and fifth spacer layers over the substrate and covering the first and second dummy gate structures; and
    patterning the first, second, third, fourth, and fifth spacer layers to form a first gate spacer on a sidewall of the first dummy gate structure and a second gate spacer on a sidewall of the second dummy gate structure.

2. The method of claim 1, wherein etching the portions of the second and third spacer layers is performed such that the first spacer layer remains within the second region of the substrate.

3. The method of claim 1, wherein patterning the first, second, third, fourth, and fifth spacer layers is performed such that a portion of the isolation structure within the second region of the substrate is etched.

4. The method of claim 1, wherein the third spacer layer is thicker than the first, second, fourth, and fifth spacer layers.

5. The method of claim 1, wherein forming fourth and fifth spacer layers is performed such that the fourth spacer layer is in contact with ends of remaining portions of the second and third spacer layers.

6. The method of claim 1, further comprising performing an implantation process to form doped regions in the first and second semiconductor fins after forming the first spacer layer and prior to forming the second and third spacer layers.

7. The method of claim 6, wherein the first spacer layer comprises impurities the same as the doped regions, and the first spacer layer has higher impurities concentration than the second and third spacer layers.

8. The method of claim 1, wherein the first dummy gate structure is wider than the second dummy gate structure.

9. A method, comprising:
forming a first semiconductor fin and a second semiconductor fin over a first region and a second region of a substrate, respectively;
forming a first gate structure and a second gate structure over and crossing the first semiconductor fin and the second semiconductor fin, respectively;
forming a first gate spacer on a sidewall of the first gate structure, the first gate spacer comprising a first layer, a second layer over the first layer, a third layer over the second layer, a fourth layer over the third layer, and a fifth layer of the fourth layer, wherein the first layer, the third layer, and the fifth layer of the first gate spacer are made of a first same material;
forming a second gate spacer on a sidewall of the second gate structure, the second gate spacer comprising a first layer, a second layer over the first layer, and a third layer over the second layer, wherein the first layer and the third layer of the second gate spacer are made of a second same material, and wherein a lateral width of the first gate spacer is greater than a lateral width of the second gate spacer; and
forming first epitaxy source/drain structures on opposite sides of the first gate structure and forming second epitaxy source/drain structures on opposite sides of the second gate structure, wherein the first epitaxy source/drain structures and the second epitaxy source/drain structures are formed at a same time.

10. The method of claim 9, wherein a lateral width of the first gate structure is greater than a lateral width of the second gate structure along a first direction.

11. The method of claim 10, wherein a lateral width of the first semiconductor fin is greater than a lateral width of the second semiconductor fin along a second direction substantially vertical to the first direction.

12. The method of claim 9, wherein the third layer of the first gate spacer is thicker than the first, second, fourth, and fifth layer of the first gate spacer.

13. The method of claim 9, wherein the third layer of the first gate spacer is thicker than the first, second, and third layer of the second gate spacer.

14. The method of claim 9, wherein each of the second layer and the fourth layer of the first gate spacer is made of a material different from the material of the first, third, and fifth layer of the first gate spacer.

15. The method of claim 9, wherein the fourth layer of the first gate spacer and the second layer of the second gate spacer are made of a same material, and are made of a different material from the first layer, the third layer, and the fifth layer of the first gate spacer.

16. A method, comprising:
forming a first semiconductor fin and a second semiconductor fin over a first region and a second region of a substrate, respectively;
forming a first gate structure and a second gate structure over the first semiconductor fin and the second semiconductor fin, respectively, wherein the first gate structure being wider than the second gate structure along a first direction;
forming a first spacer layer over the first gate structure and the second gate structure;
forming a second spacer layer over the first spacer layer;
removing a portion of the second spacer layer over the entire second region of the substrate, such that an entirety of the first spacer layer over the entire second region of the substrate is exposed;
forming a third spacer layer over the second spacer layer after removing the portion of the second spacer layer; and
patterning the first, second, and third spacer layers to form first gate spacers on sidewalls of the first gate structure and second gate spacers on sidewalls of the second gate structure.

17. The method of claim 16, further comprising performing an implantation process to form doped regions in the first and second semiconductor fins after forming the first spacer layer and prior to forming the second spacer layer.

18. The method of claim 16, further comprising forming an isolation structure over the substrate and between the first semiconductor fin and the second semiconductor fin, wherein patterning the first, second, and third spacer layers is performed such that the isolation structure has a stepped top surface.

19. The method of claim 16, wherein the third spacer layer is in contact with a portion of the first spacer layer over the second region of the substrate.

20. The method of claim 16, wherein the first semiconductor fin is wider than the second semiconductor fin along a second direction perpendicular to the first direction.

* * * * *